United States Patent [19]
Nakazawa et al.

[11] Patent Number: 5,219,615
[45] Date of Patent: Jun. 15, 1993

[54] METHOD AND APPARATUS FOR FORMING A COATING OF A VISCOUS LIQUID ON AN OBJECT

[75] Inventors: Shigeyasu Nakazawa; Nobunari Nadamoto; Souichi Matsuo; Mitsuru Iida, all of Tokyo, Japan

[73] Assignee: Dai Nippon Insatsu Kabushiki Kaisha, Tokyo, Japan

[21] Appl. No.: 822,107

[22] Filed: Jan. 17, 1992

Related U.S. Application Data

[62] Division of Ser. No. 481,292, Feb. 20, 1990, Pat. No. 5,099,782.

[30] Foreign Application Priority Data

Feb. 17, 1989 [JP] Japan .................................. 1-37688

[51] Int. Cl.$^5$ ............................................. B05D 3/12
[52] U.S. Cl. ................................. 427/240; 427/284; 427/358
[58] Field of Search ........................ 427/240, 358, 284

[56] References Cited

U.S. PATENT DOCUMENTS 4,822,639  4/1989  Fujii et al. .......................... 427/240

OTHER PUBLICATIONS

IBM Technical Disclosure Bulletin, vol. 20, No. 18 Mar. 1978.
IBM Technical Disclosure Bulletin, vol. 19, No. 3, Aug. 1976.

*Primary Examiner*—Janyce Bell
*Attorney, Agent, or Firm*—Wegner, Cantor, Mueller & Player

[57] ABSTRACT

A relatively large-sized square substrate for use in the production of a color filter for liquid crystal display, a color image sensor or the like is applied with a coating film of a viscous liquid such as a photosensitive resin. For producing the coating film, the substrate is placed with its surface extending horizontally and the viscous liquid is dropped on the surface in a line along an edge portion of the surface. Then, a squeezee rod is moved along the surface with a predetermined gap maintained between the squeezee rod and the surface, to spread the viscous liquid over at least a part of the surface, whereby a predetermined thickness of the spread viscous liquid is obtained. Thereafter, the substrate is spinned in the plane of the surface thereof to disperse the spread viscous liquid uniformly by centrifugal force over the entire surface of the substrate, whereby a thin coating of the liquid of a uniform thickness is formed on the surface of the substrate.

7 Claims, 20 Drawing Sheets

METHOD AND APPARATUS FOR FORMING A COATING OF A VISCOUS LIQUID ON AN OBJECT

This application is a divisional of U.S. patent application Ser. No. 07/481,292, filed Feb. 20, 1990, now U.S. Pat. No. 5,099,782.

BACKGROUND OF THE INVENTION

The present invention relates to a method and an apparatus for forming a coating of a thin, uniform film of viscous liquid, by using a small amount of the liquid, on a surface of an object having a comparatively large surface area.

Conventionally, as the methods for the formation of a film of a resist, such as a pigment-dispersed resist or a water soluble resist on rectangular substrates and the like having a relatively large size (150 mm × 150 mm or larger) for use in color image sensors and color filters for LCD, there have been known a spin coating method in which centrifugal force is used to disperse a resist over the entire flat surface of the substrate, and a roll coating method in which a roll is used to transfer the resist.

In the spin coating method, the substrate is held by suction against a spinner chuck. Then viscous liquid is dropped over the upper surface of the substrate which is to be coated, while the substrate is rotated, so that centrifugal force causes the viscous liquid to spread over the top surface of the substrate.

In this method, the substrate is held by suction against the spinner chuck and the places where the suction force is exerted are thereby deformed downwards so that the thickness of the applied layer is thicker at such places to cause unevenness of the coating. This is not desirable for the reasons to be described later. In addition, in this method, there is formed a "fringe" where there is an excess thickness of the viscous liquid along the rim. This is also not desirable for the reasons to be described later. Furthermore, in this spin coating method, the amount of the drops of viscous liquid that is actually used to form the layer is no more than 2% to 3% and so the method is uneconomical.

On the other hand, in the known roll coating method, the viscous liquid consumption is less than that in the spin coating method, but unevenness in the shape of lines occurs in the direction parallel to the direction of movement of the roll, so that the substrate to which the viscous liquid has been applied cannot be used as a filter for high-quality image displays.

Japanese Patent Laid-Open Pub. No. 63-246820 discloses a method wherein for the application of a photo-sensitive resin to a flat plate object, a roll coater is used to apply the resin, and then the flat object is rotated at a predetermined speed to spread the photo-sensitive resin.

In Japanese Patent Laid-Open Pub. No. 63-313159 there is disclosed an apparatus which comprises: a holding device that holds a substrate horizontally so as to be freely rotatable; a resist application device having a transfer roll for applying a resist, a moving means for moving the resist application device and its transfer roll portion relative to the surface of the substrate to which the resist is to be applied; and a rotating device to rotate the holding device and thereby the substrate to which the resin has been applied.

In these method and apparatus, the resin is applied by the roll coating method prior to the use of the spin coating method, but the line unevenness that occurs with the roll coating method become fixed when the roll coating has completed and cannot be smoothed even if the spin coating method is carried out thereafter. This is the same regardless of whatever resist is coated to whatever thickness. In particular, in the case of water soluble resists that have a low viscosity and a poor wettability with respect to the substrate, it is not possible to use methods that include the roll coating to apply such resists.

SUMMARY OF THE INVENTION

The object of the present invention is to provide a method and apparatus for forming a thin film of viscous liquid with a uniform thickness on a surface of an object having a comparatively large surface area by using a minimum amount of the liquid.

According to one aspect of the present invention, the above object can be attained by the provision of a method of forming a coating of a viscous liquid on a surface of an object, comprising the steps of: applying the viscous liquid along an edge portion of the surface of the object; moving a squeezee along the surface of the object with a predetermined gap therebetween to spread the applied viscous liquid over at least a part of the surface of the object, to have a predetermined thickness; and spinning the object in the plane of the surface thereof to disperse the spread viscous liquid uniformly by centrifugal force over the entire surface of the object.

According to another aspect of the present invention, the above object can be attained by the provision of an apparatus for forming a coating of a viscous liquid on a surface of an object, comprising: means for holding the object with the surface thereof maintained horizontal; coating nozzle means for applying the viscous liquid along an edge portion of the surface of the object held on the holding means; squeezee means extending across the holding means for moving along the surface of the object with a predetermined gap between the surface and the squeezee means, to spread the applied viscous liquid over at least a part of the surface to have a predetermined thickness; and means for spinning the object in the plane of the surface thereof to disperse the spread viscous liquid uniformly under centrifugal force over the entire surface of the object.

Preferred embodiments of this invention will now be described in detail, with reference to the accompanying drawings.

Figure 6:
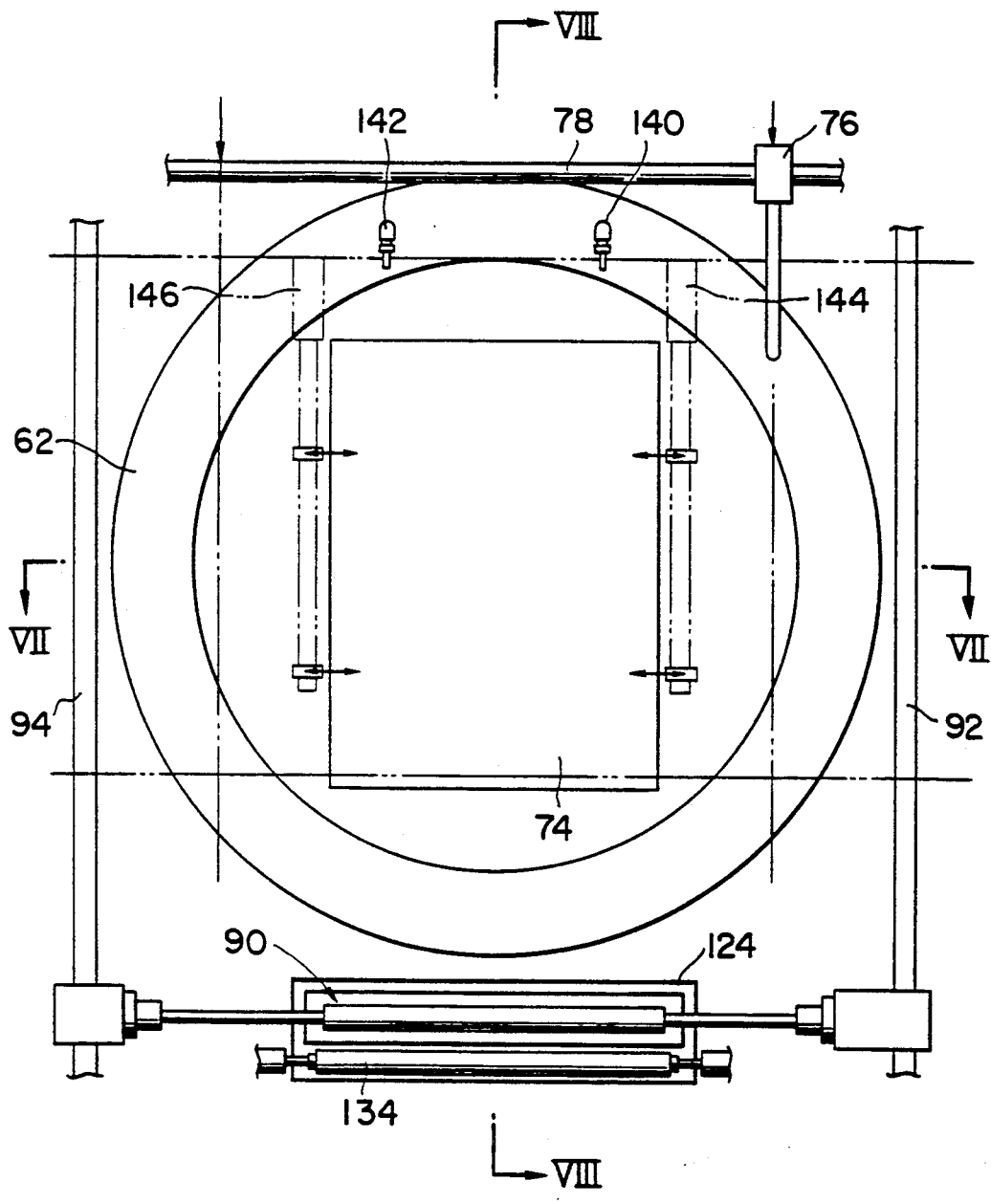
FIG. 6,7,8,9,10,11,12,13, 14 and 15 are views showing a third embodiment of the present invention, with FIG. 6 being a plan view of the main portions, FIG. 7 being a section taken along the line VII—VII of FIG. 6, FIG.
Figure 9:
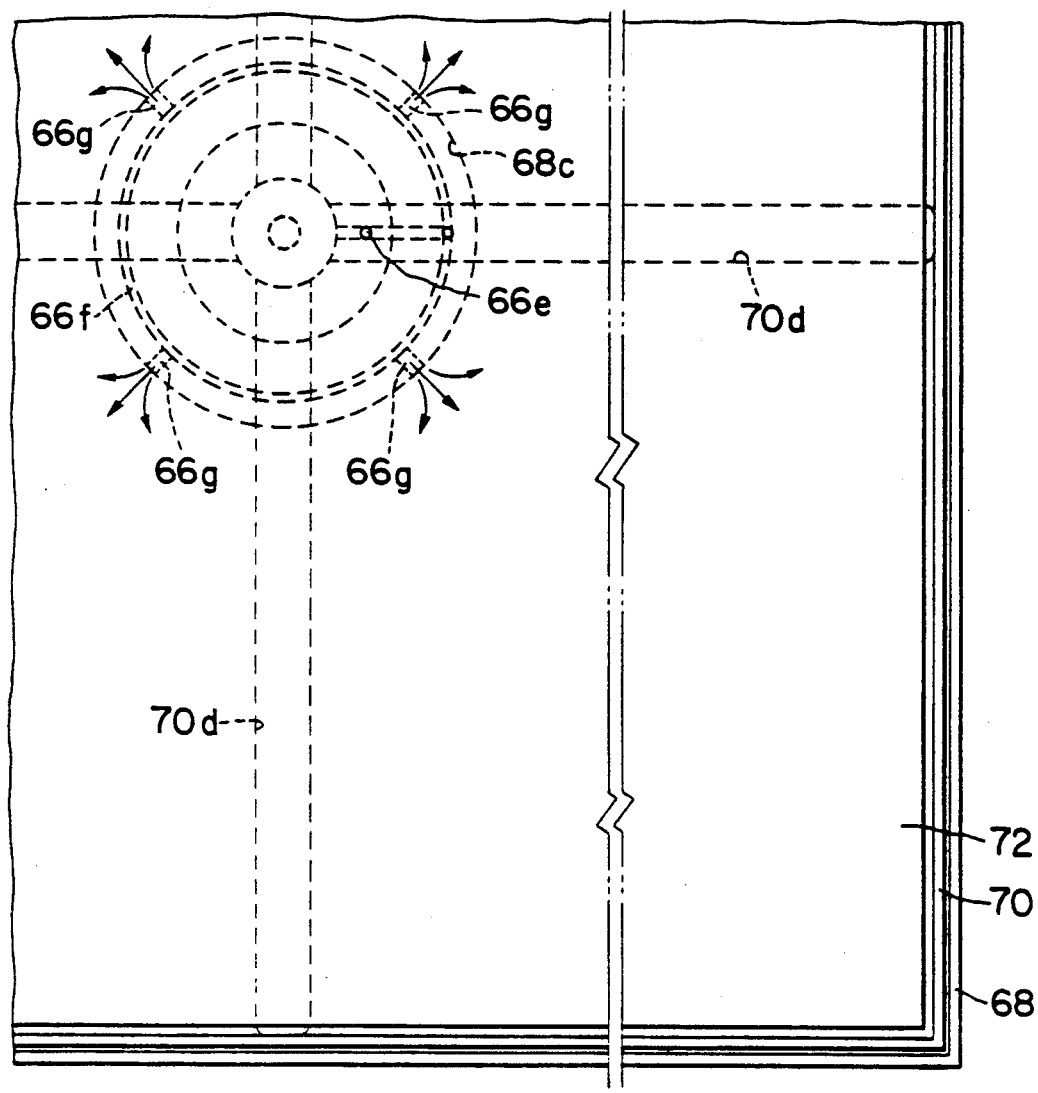
Figure 10:
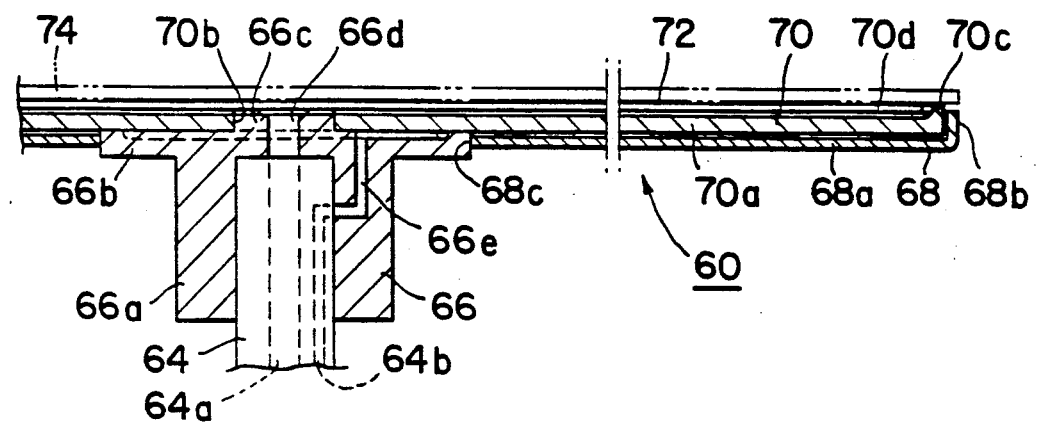
Figure 11:
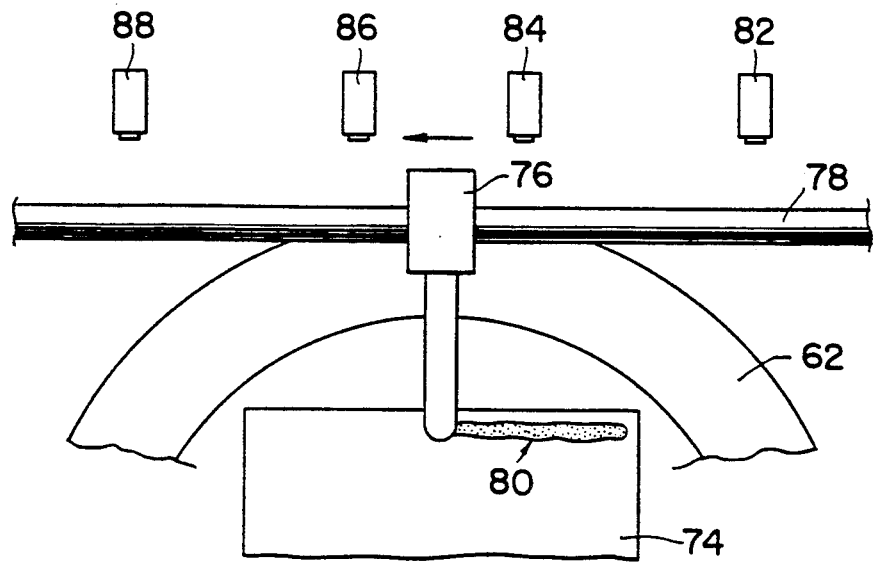
Figure 12:
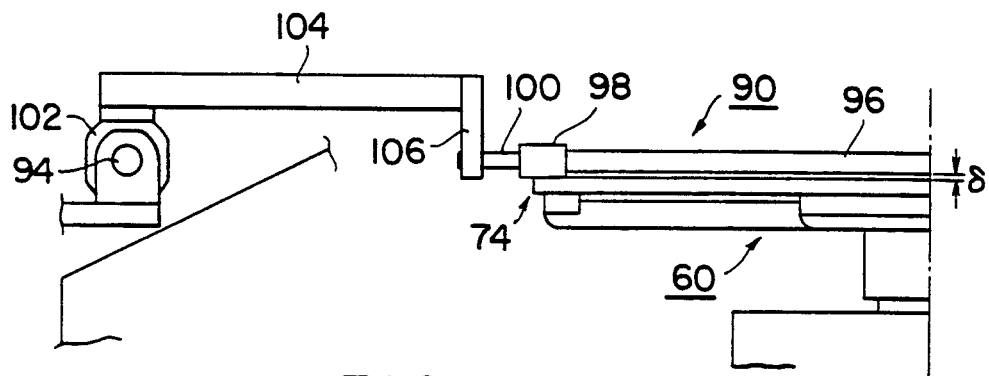
Figures 13A, 13B:
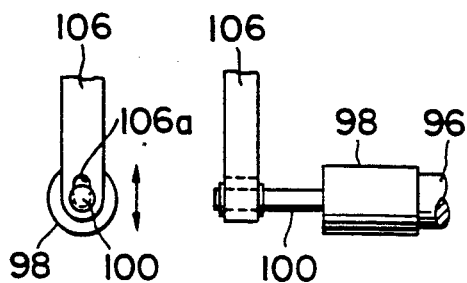
Figures 14A, 14B:
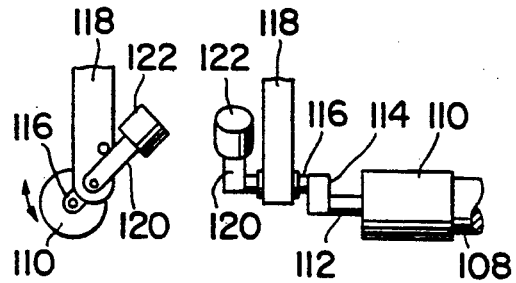
Figure 15:
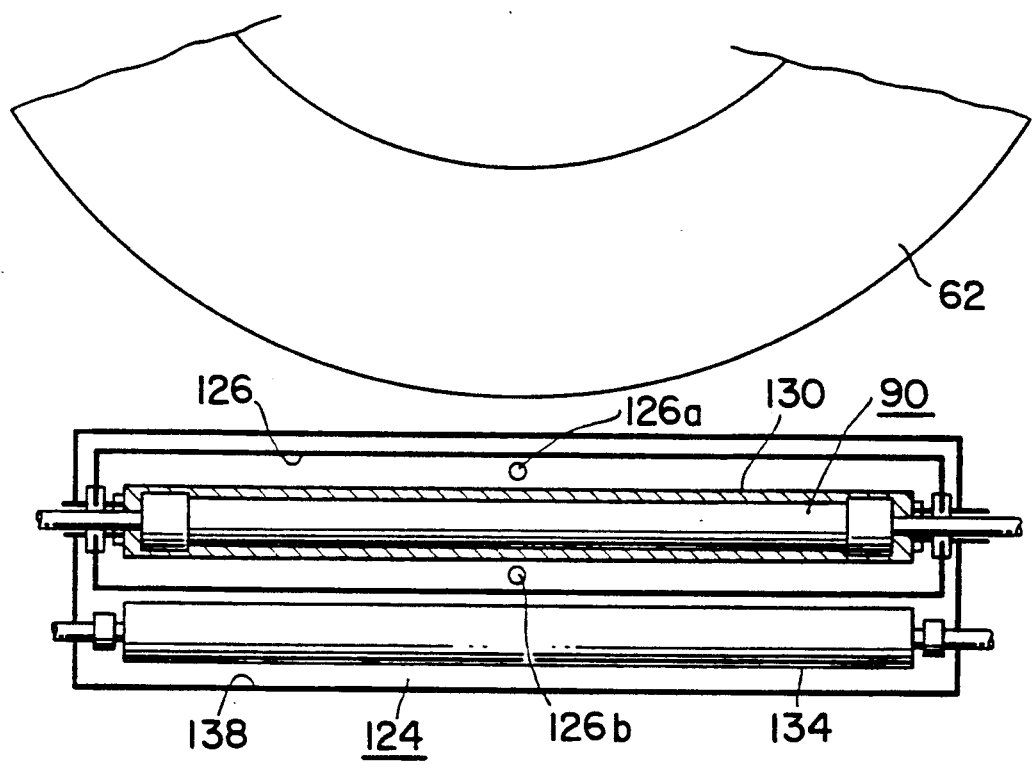
Figure 16:
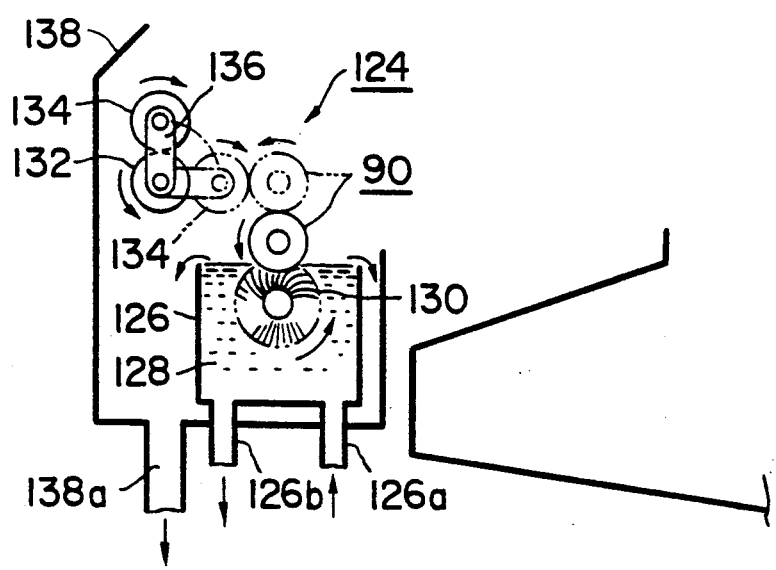
Figure 17:
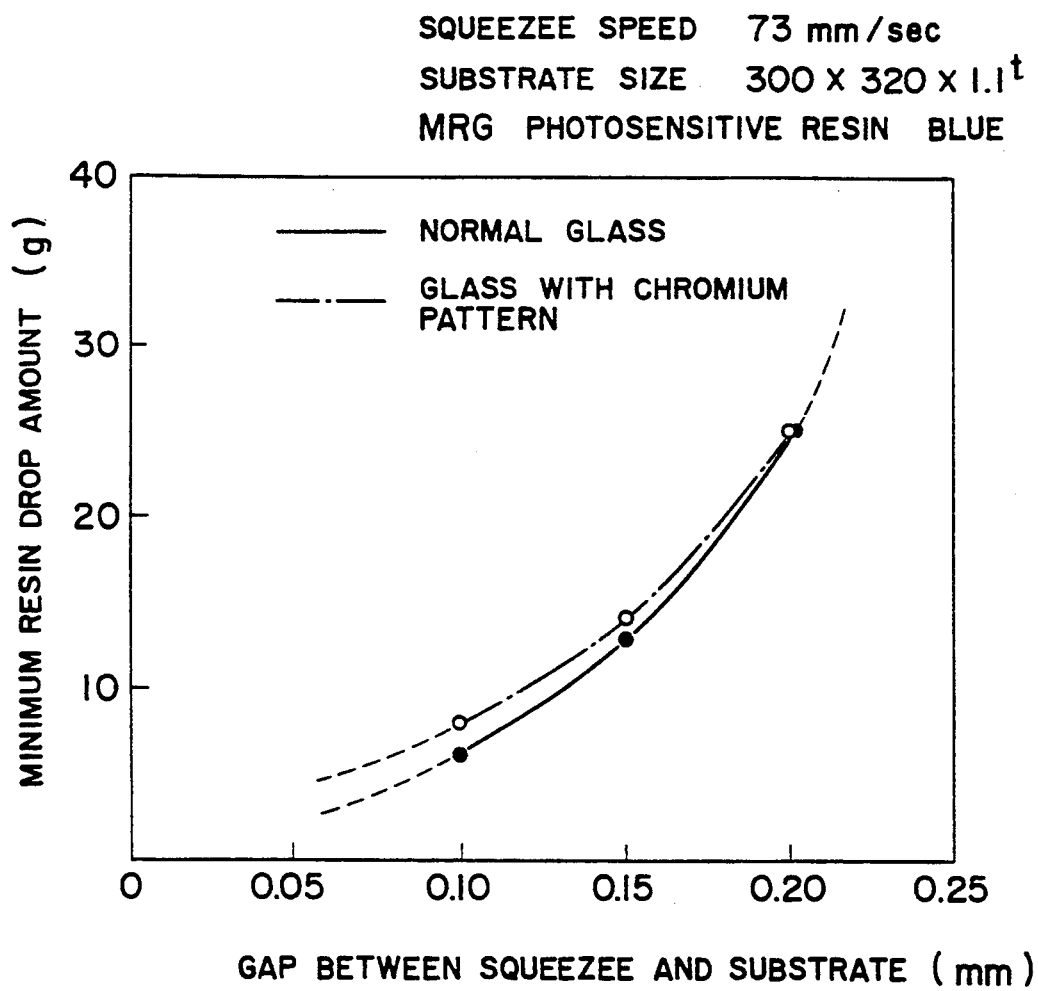
Figure 18:
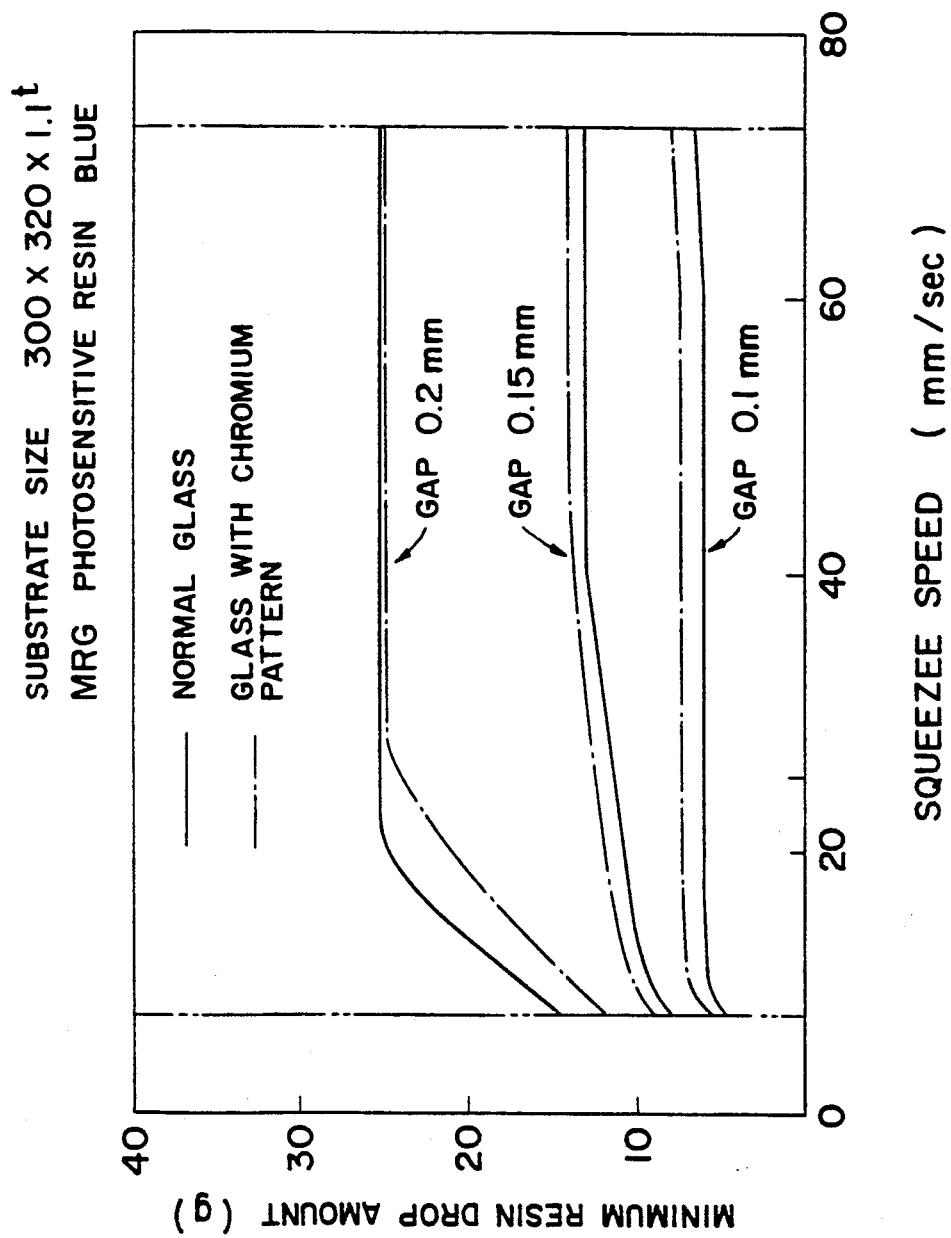
Figure 19:
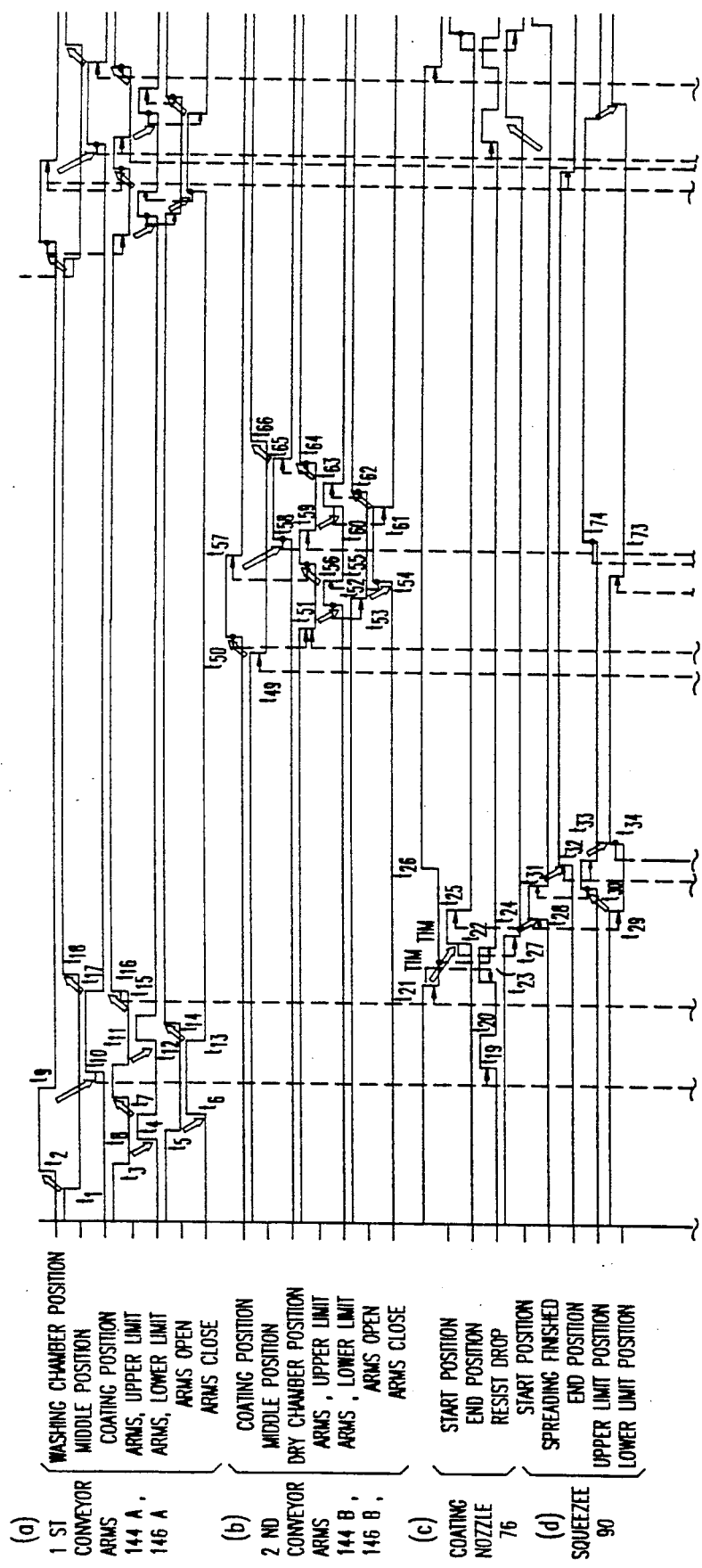
Figure 19A:
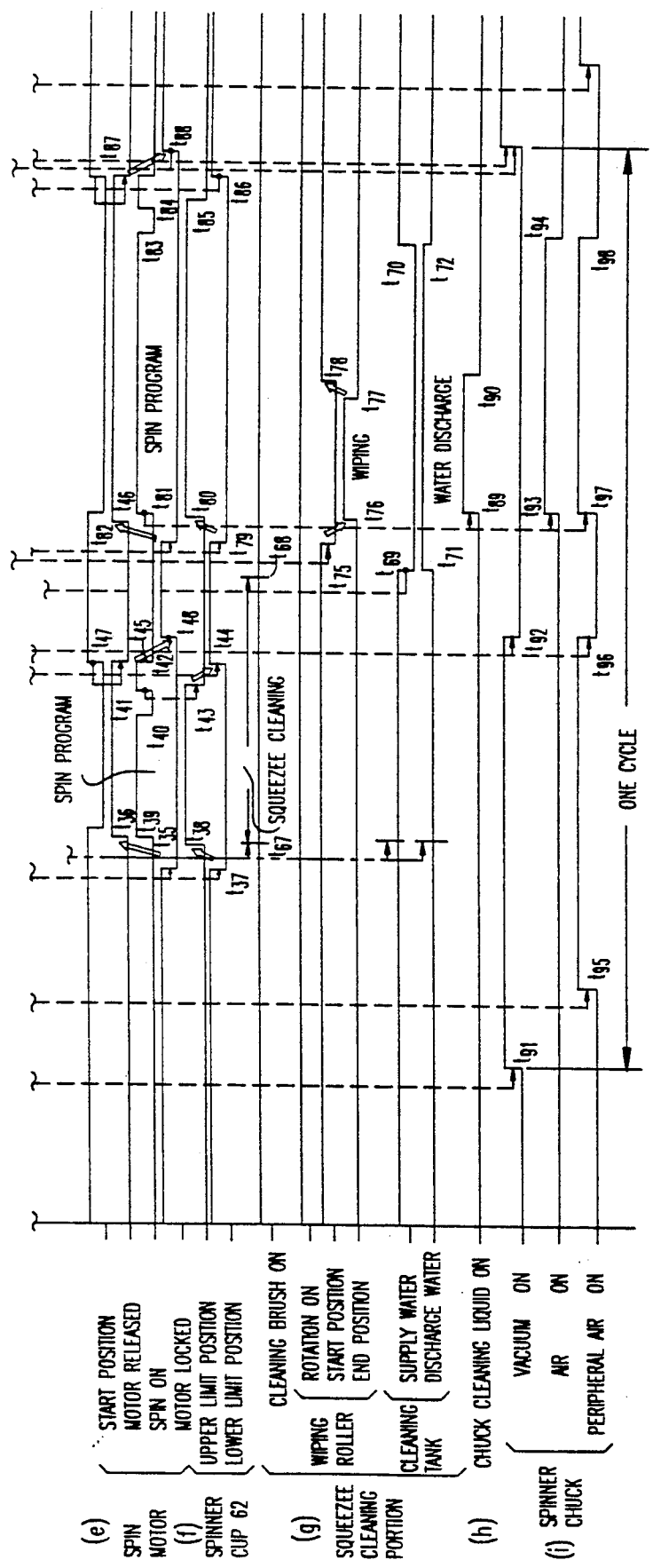
Figure 20A:
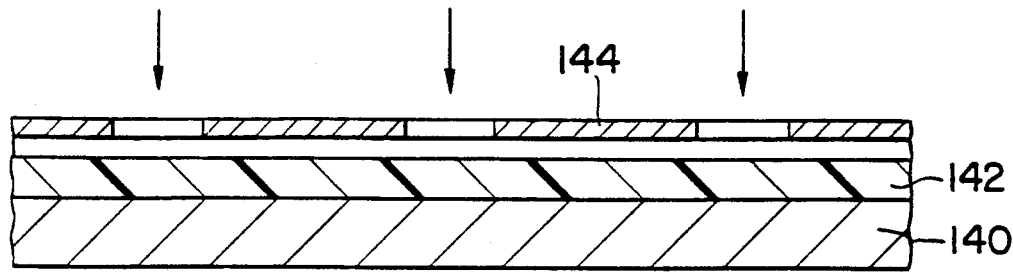
Figure 20B:
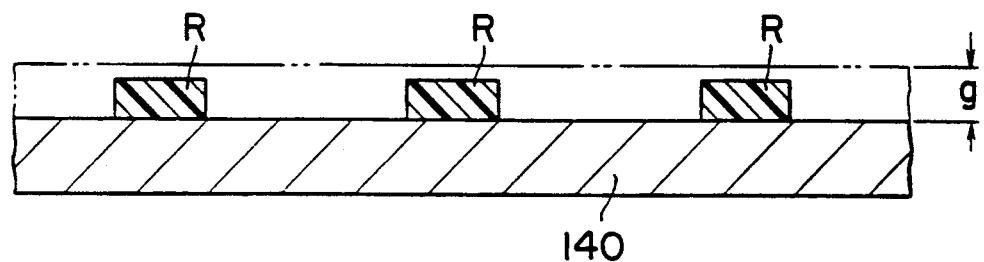
Figure 20C:
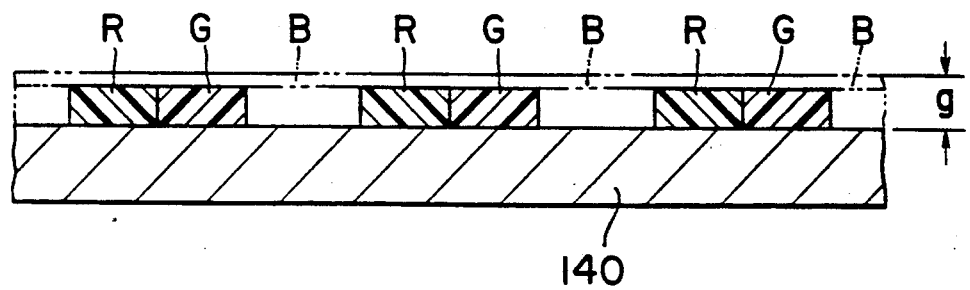
Figure 21A:
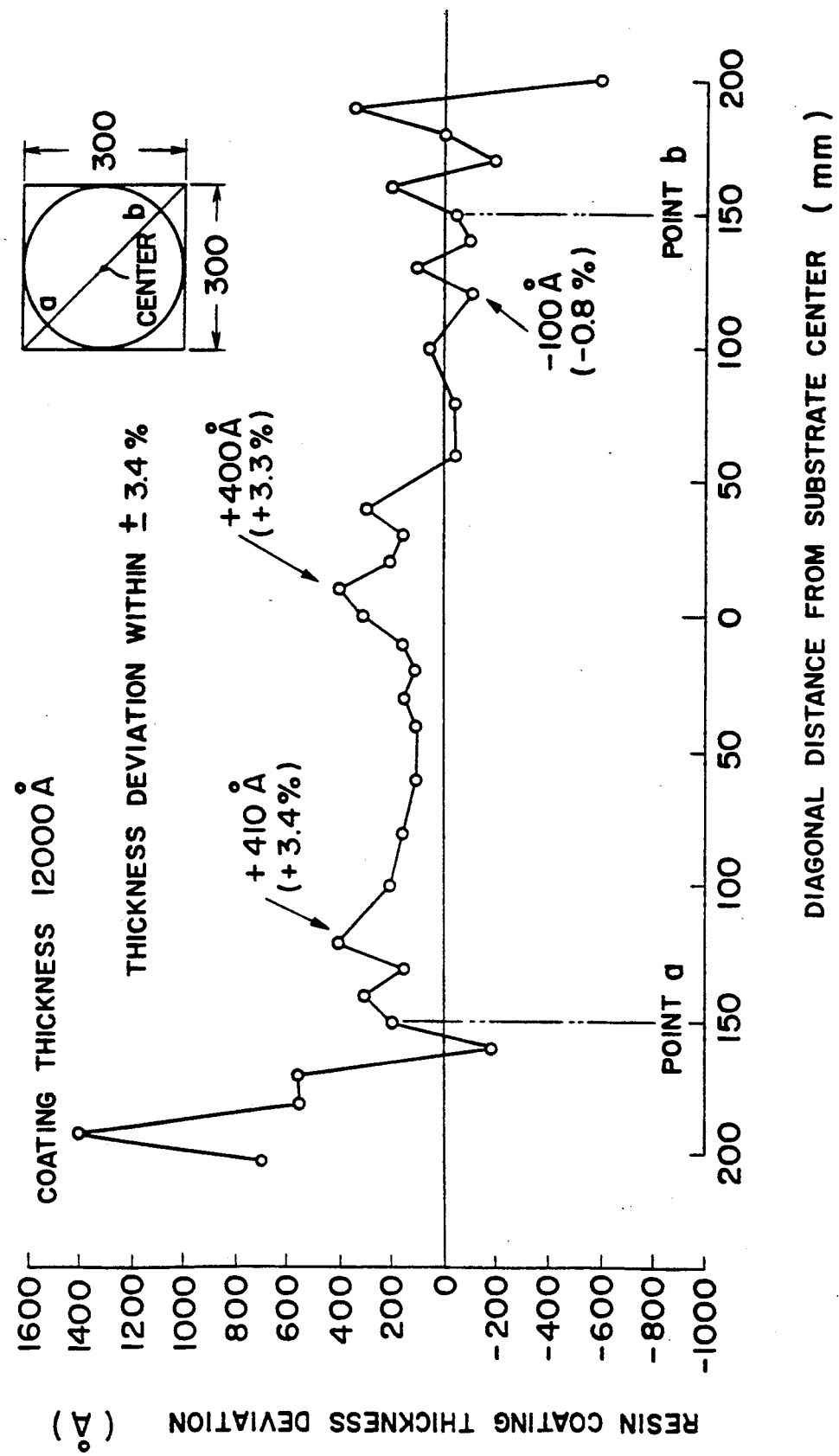
Figure 21B:
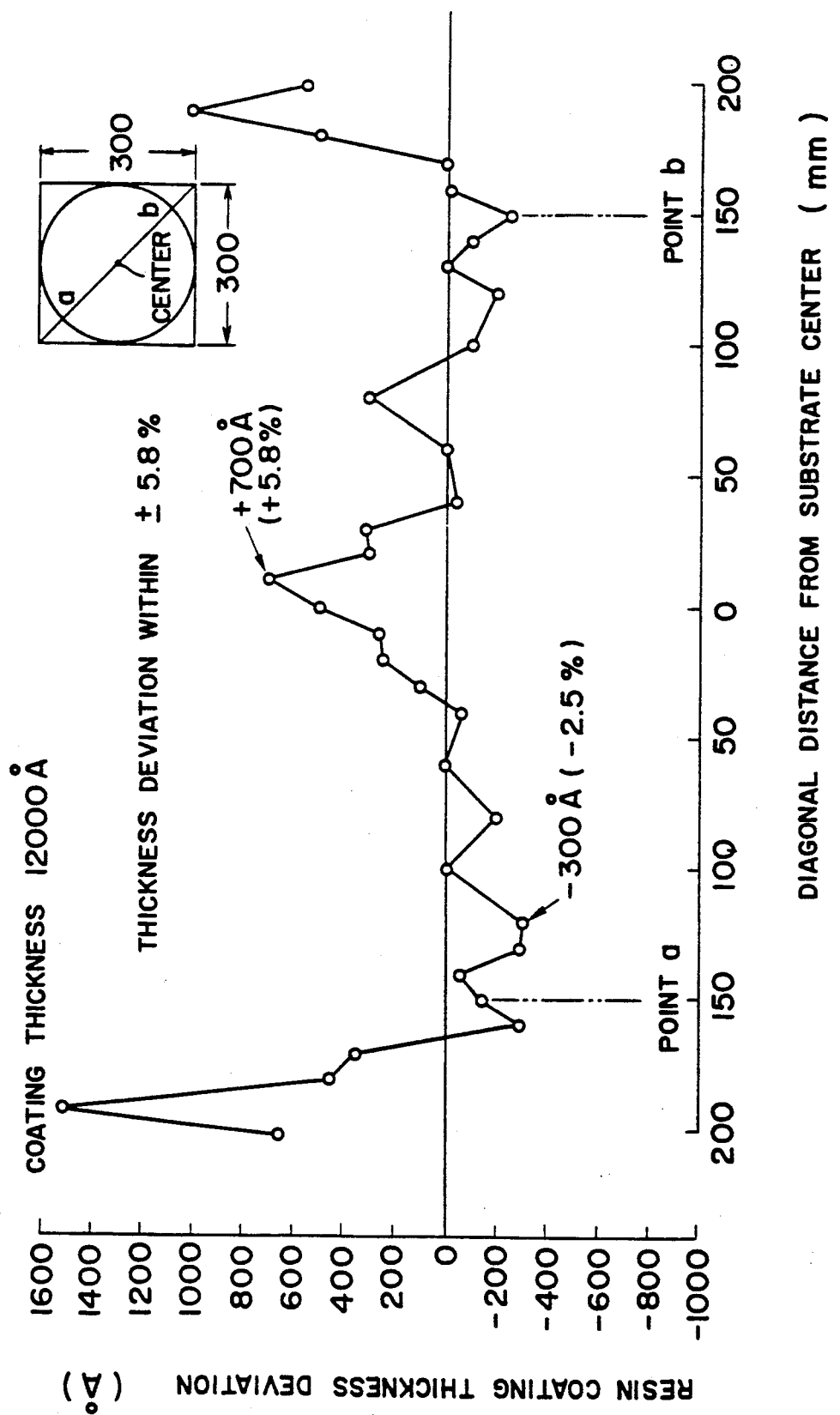
Figure 22:
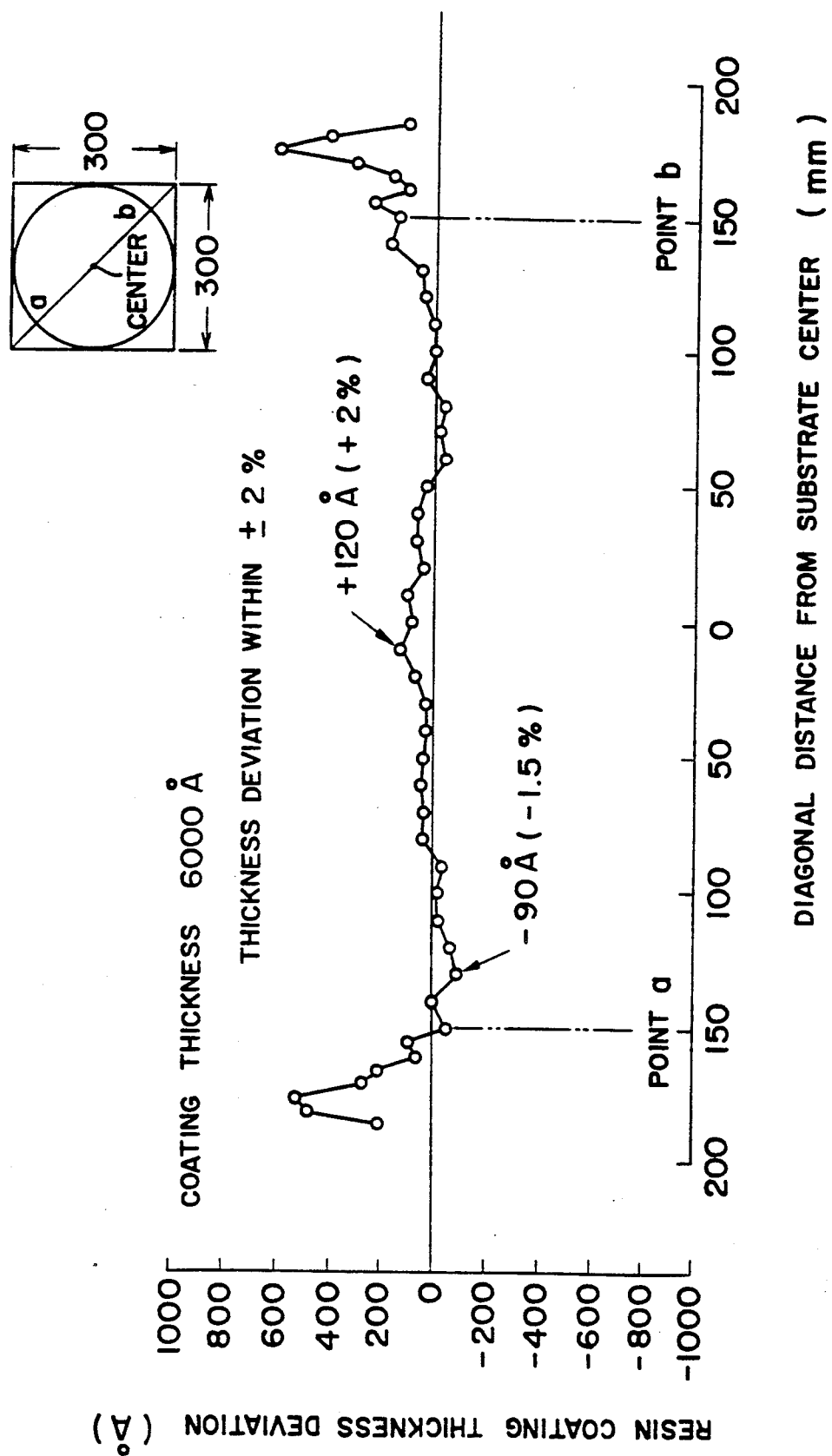
Figure 22:
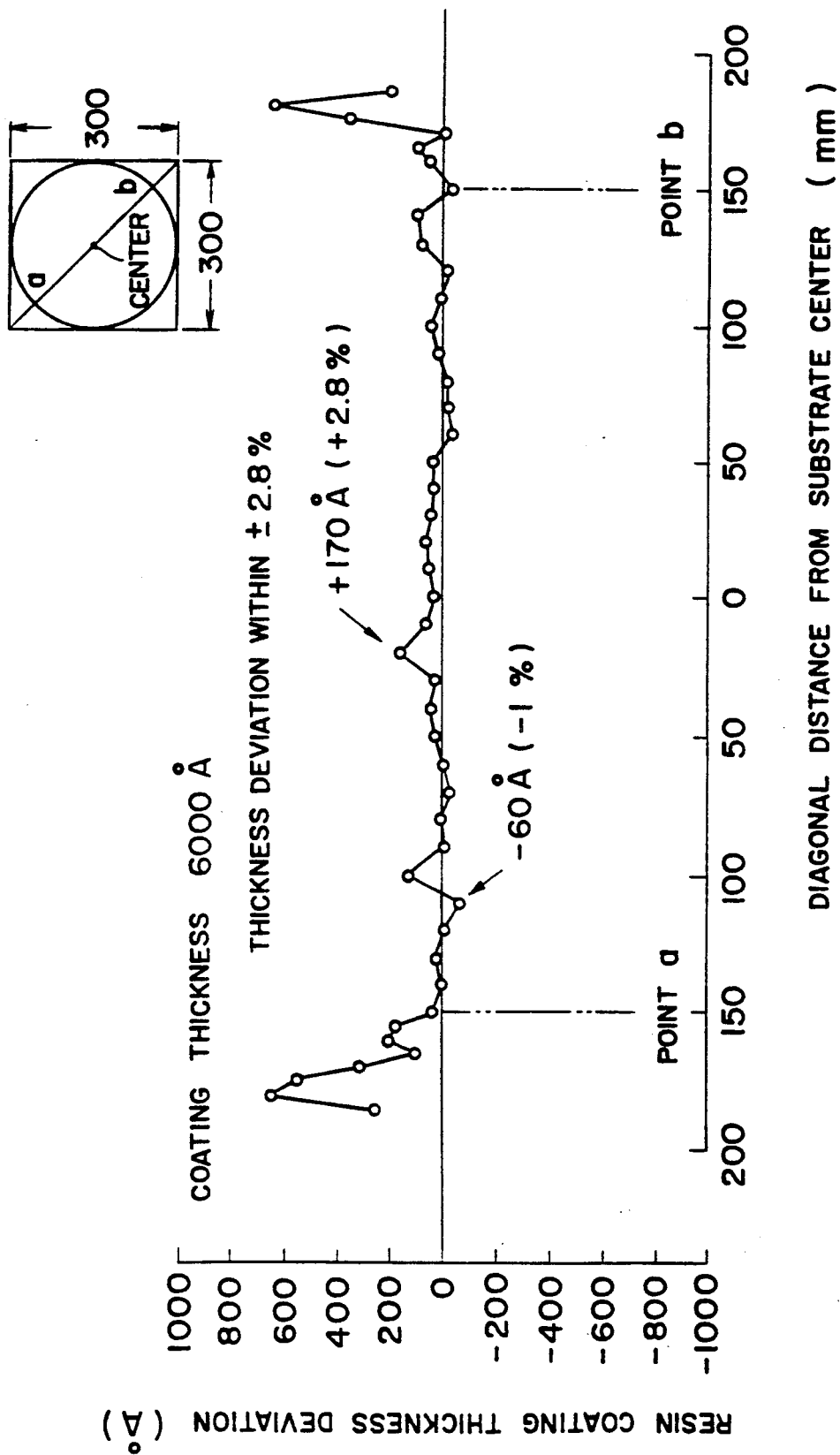
Figure 23:
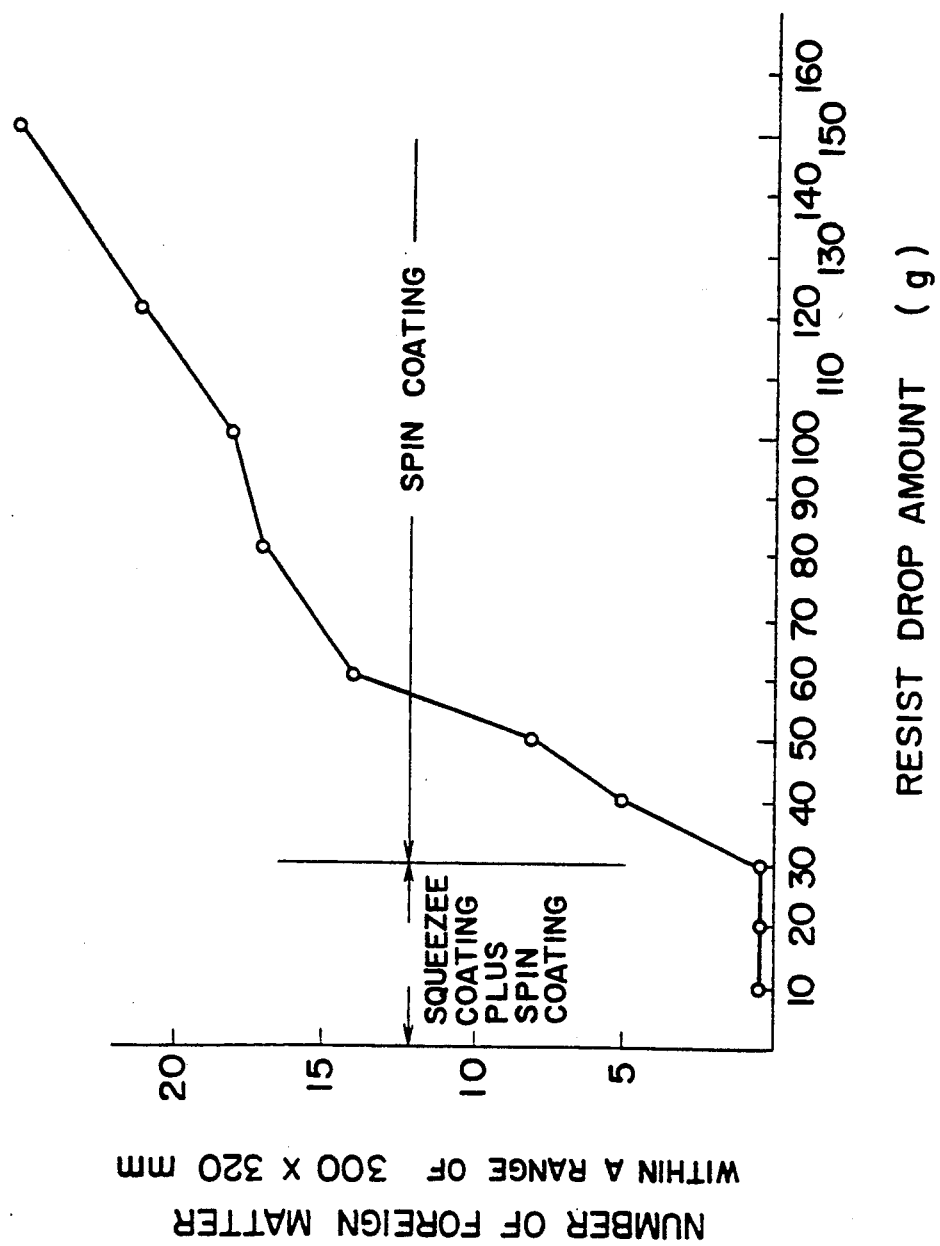
Figure 24A:
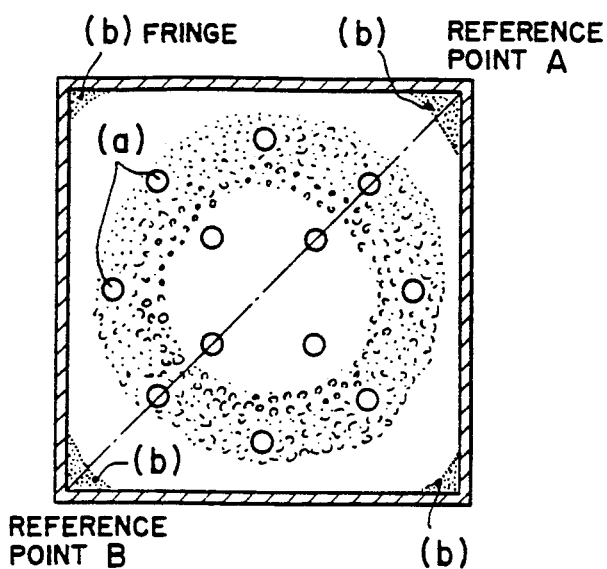
Figure 24B:
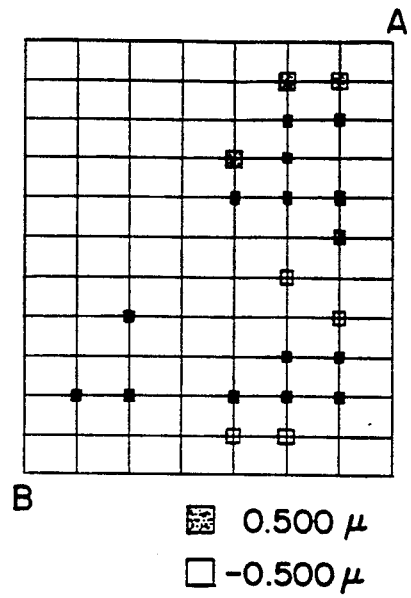
Figure 24C:
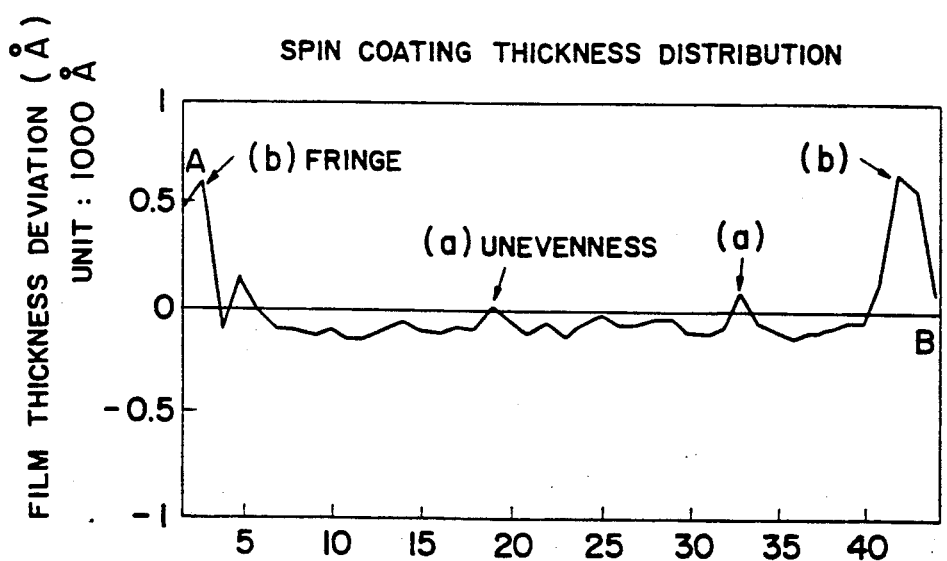
Figures 25A, 25B:
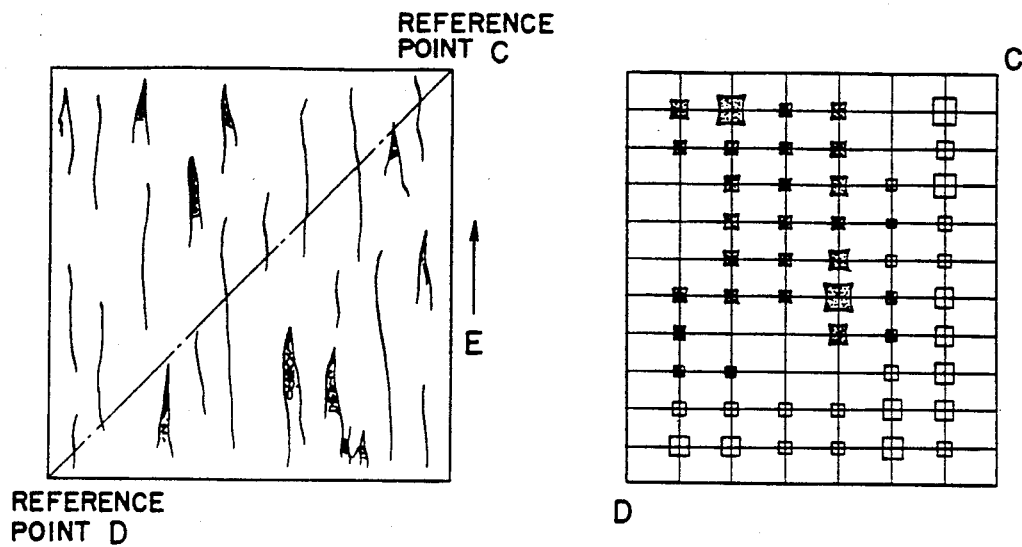
Figure 25C:
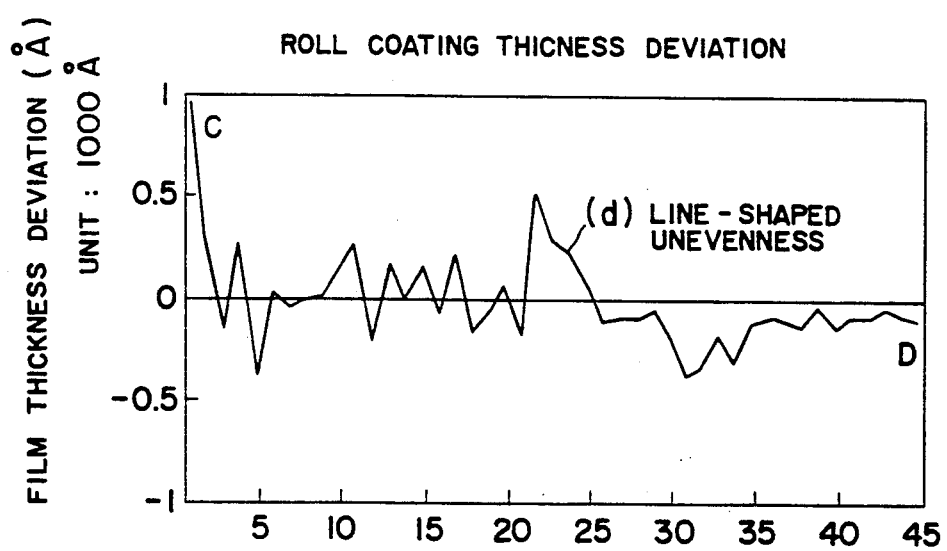

8 being a section taken along the line VIII—VIII of FIG. 6, FIG. 9 being a plan view indicating one portion of a pin chuck, FIG. 10 being an elevational section of FIG. 9, FIG. 11 being a plan view indicating an application nozzle, FIG. being a plan view indicating a squeezee portion, FIGS. 13A and 13B being enlarged fragmentary side and front views, respectively, of the squeezee portion of FIG. 12, FIGS. 14A and 14B being side and front views, respectively, showing a modification of the squeezee portion, FIG. 15 being a plan view indicating a squeezee cleaning tank, and FIG. 16 being an elevational section of the squeezee cleaning tank of FIG. 15;

FIG. 17 and FIG. 18 are graphs for describing the characteristics of the third embodiment of the present invention, with FIG. 17 being a graph indicating the relationship between the amount of gap between the squeezee and the substrate, and the minimum amount of resist drops, and FIG. 18 being a graph indicating the relationship between the squeezee moving speed and the minimum amount of resist drops;

FIG. 19 is a process diagram showing the operations of various parts of the apparatus for forming a coating according to the third embodiment;

FIG. 20A through FIG. 20C show sequential process steps for manufacturing a color filter;

FIG. 21A and FIG. 21B are graphs for comparison of the thickness distribution of the coatings formed according to the third embodiment and according to a conventional method, respectively;

FIG. 22A and FIG. 22B are graphs similar to FIG. 21A and FIG. 21B but showing the thickness distribution of the coatings formed, under conditions different from those of FIG. 21A and FIG. 21B, according to the third embodiment and according to a conventional method, respectively;

FIG. 23 is a graph indicating a comparison of the relationship between foreign matter and the resist drop amount for the third embodiment of the present invention, and those of a conventional apparatus;

FIG. 24A, FIG. 24B and FIG. 24C are diagrams for explaining the problems with the conventional spin coating method; and FIG. 25A, FIG. 25B and FIG. 25C are diagrams for explaining the problems with the conventional roll coating method.

DETAILED DESCRIPTION OF THE PREFERRED EMBODIMENTS

Prior to a description of embodiments according to the present invention, FIGS. 24A through 25C will be referred to for a description of the problems involved in the conventional spin coating method and the roll coating method.

FIG. 24A shows an example in which a resist film with a thickness of 1.0 $\mu m \pm 3\%$ is formed on a substrate having a comparatively large size (300 mm $\times$ 320 mm $\times$ 1.1 'mm), by using the conventional spin coating method.

FIG. 24B is a graph indicating the results of measuring the film thickness on a lattice, and FIG. 24C is a graph indicating the results of continuous measurement of the film thickness between reference points A and B (FIG. 24A). As can be seen from these graphs, with the spin coating method, the substrate is held against spinner chucks by a downward suction force, so that the bending of the substrate at places where the suction force is applied causes the film thickness to increase because of local downward deformation of the above places. This increase of the thickness is known as chucking unevenness which is indicated at a in FIG. 24A. The unevenness a does not exert a large influence on the quality of color filters after a plural number of relatively small-sized color filters are formed on a large-sized substrate and then cut and separated for use. However, when color filters are formed on a large substrate for use in large LCD having a screen size of 10 to 14 inches, chucking unevenness becomes a cause of unevenness in the screen brightness and density and these unevennesses are difficult to avoid. In addition, fringes b are formed where the resist rises up along the rim and this creates the problem of poor adhesion or contact in the case of exposure of the filters to the light.

Furthermore, the resist consumption is 10 to 15 grams per sheet when a solvent type photoresist (such as OFPR-800, product of Tokyo Ohka Kogyo Kabushiki Kaisha, Japan) is used, while when a water soluble resist is used, the resist consumption is 80 to 120 grams per sheet, and changes depending upon the color formed. In these cases, the resist that is actually applied to the substrate is only 2 to 3% of the resist that is dropped and efficient usage cannot be made of the high-priced resist, thus resulting in the problem of a high material cost.

On the other hand, in the conventional roll coating method, when a solvent type photoresist with a thickness of 1.0 $\mu m \pm 10\%$ is formed on a substrate of the same size as shown in FIG. 25A, the amount of the resist used is 5 grams per sheet which is less than that with the spin coating method. However, line-shaped unevenness d is generated in the direction parallel to the direction E of movement of the rolls. FIG. 25B is a graph indicating the results of measuring the film thickness on a lattice, and FIG. 24C is a graph indicating the results of continuous measurement of the film thickness between the reference points C and D (FIG. 25A), from which the existence of line-shaped unevenness d can be recognized. Such line-shaped unevenness d is generated irrespective of the type of resist, and because of this, the deviation of the thickness of the film of the resin formed upon a flat substrate surface becomes $\pm 10\%$. Therefore, the products cannot be used for filters for high-quality image displays.

Figure 1:
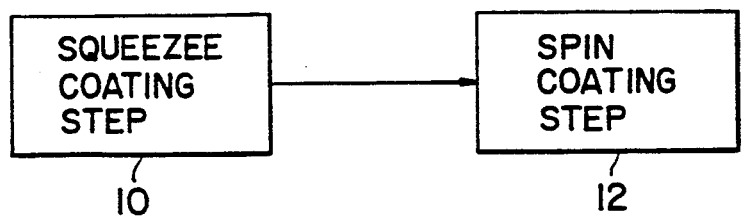
FIG. 1 is a block diagram indicating the general principle of the method of application of a viscous liquid, according to the present invention.

FIG. 1 is a block diagram indicating the basic principle of the present invention.

The method for forming a coating of a viscous liquid according to the present invention comprises a squeezee coating step 10 and a spin coating step 12.

The squeezee coating step 10 is a process wherein the viscous liquid that has been dropped on one end portion of the surface to be coated of the object for coating is spread on the entire or a partial area of the surface to be coated of the object. The prior spreading of the viscous liquid on the surface to be coated in this step enables a small amount of viscous liquid to be used in the later steps, and also enables the coating to be uniform.

The viscous liquid that is used can have a viscosity of 10 to 100 cps, and can be a solvent-type photo-sensitive resin, a water soluble photo-sensitive resin, a photo-sensitive resins that includes color materials such as pigments, various types of adhesives, a resin for the formation of protector layers, or ink and the like.

The thickness of the coating applied in this squeezee coating step is preferably from 30 to 200 $\mu m$, and coating may be formed on the entire surface of the object or on a partial area of 80 to 90% of the entire surface including the center of the substrate at the central part of the partial area.

The squeezee coating step 10 does not involve dropping the viscous liquid onto an effective portion of the surface for coating, so that unevenness due to the dropping does not occur. In addition, forced smoothing can be performed with respect to protrusions and concavities inside the effective portions of the coating surface, whereby there is no flow of the viscous liquid along concavities as is peculiar to conventional coating methods.

The spin coating step 12 is a process wherein centrifugal force is used to uniformly disperse the viscous liquid over the entire surface of the surface to be coated of the object.

In this step, the viscous liquid has been applied beforehand so that the amount of fly-off of the viscous liquid can be greatly reduced and there is also no splashing of the viscous liquid whereby the formation of protruded parts is reduced.

Figure 2:
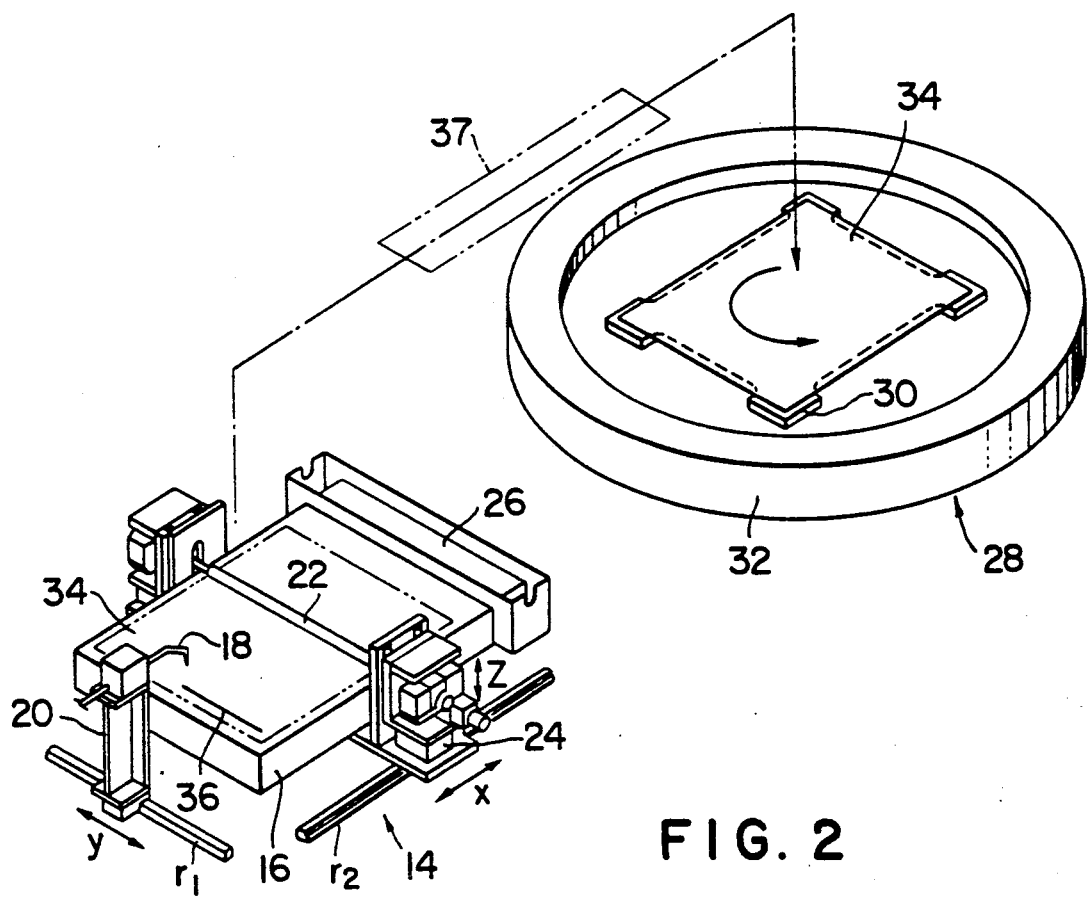
FIG. 2 is a perspective view showing a first embodiment of the method of application of a viscous liquid, according to the present invention.

FIG. 2 is a perspective view showing a first embodiment of the apparatus for forming a coating of a viscous liquid, according to the present invention. The apparatus according to the first embodiment is essentially divided into a squeezee coating portion 14 and a spin coating portion 28.

The squeezee coating portion 14 comprises a mounting table 16, a coating nozzle 18, a squeezee 22 and a squeezee cleaning tank 26. The coating nozzle 18 is provided on one side (left side as viewed) of the mounting table 16. The coating nozzle 18 is the nozzle that supplies and drops a resist 36 such as a photosensitive resist, and is moved by a carriage 20 which is driven along a rail $r_1$ by a motor such as a DC motor at a constant speed in the y-direction.

The squeezee 22 is provided to extend in a front-to-rear direction or transversely to the mounting table 16. This squeezee 22 moves at a constant speed in the x-direction by a carriage 24 that moves along a rail $r_2$ by a DC motor provided on the front side of the mounting table 16. In addition, the squeezee 22 can also move vertically or in the z-direction so that the gap or clearance between the squeezee 22 and the upper surface of a substrate 34 fixedly mounted on the table 16 can be adjusted.

The squeezee cleaning tank 26 is provided on the other side (right side as viewed) of the mounting table 16. The squeezee cleaning tank 26 is the tank for cleaning and drying the squeezee 22 immediately after the completion of one cycle of operation.

The spin coating portion 28 is comprised of a spinner chuck 30 and a spinner cup 32. The spinner chuck 30 has portions that apply a suction force to and holds a substance 34 and rotates at high speed. The spinner chuck 30 uses a rim vacuum suction method and prevents the chucking unevenness within the effective picture elements. The spinner cup 32 is a container with a shape to collect the resist 36 that is dispersed when the spinner chuck 30 rotates.

The following is a more detailed description of a practical example of the operation of the viscous liquid coating apparatus of the present invention.

In the following example, the substrate 34 had a size of 300 mm × 320 mm × 1.1 ′ mm, and a resist with pigment dispersed was used as the resist 36 which is to be coated to a thickness of 1.3 μm.

When the substrate 34 was conveyed onto, and fixed to the mounting table 16, the coating nozzle 18 was moved parallel to the end edge of the substrate 34 and 10 to 25 grams of the resist 36 was dropped from the nozzle 18. Then, the gap between the squeezee 22 and the substrate 34 was set to 200 μm and the squeezee 22 was moved at a speed of 5 cm/sec, whereby the resist 36 which has dropped onto the substrate 34 was spread over the entire surface of the substrate.

The substrate 34 to which the resist 36 had been applied in the squeezee coating portion 14 was conveyed by an automatic conveying apparatus 37 to the spin coating portion 28. During the time that the substrate 34 was being conveyed, the squeezee 22 was moved into the squeezee cleaning tank 26 in which the squeezee 12 was cleaned and dried.

The substrate 34 that had been conveyed to the spin coating portion 28 was sucked by the spinner chuck 30 and spun at 1900 rpm for 2 to 3 seconds. As a result, a resist coating of 1.3 μm 2% was formed on the effective picture element area of the substrate 34.

Figure 3:
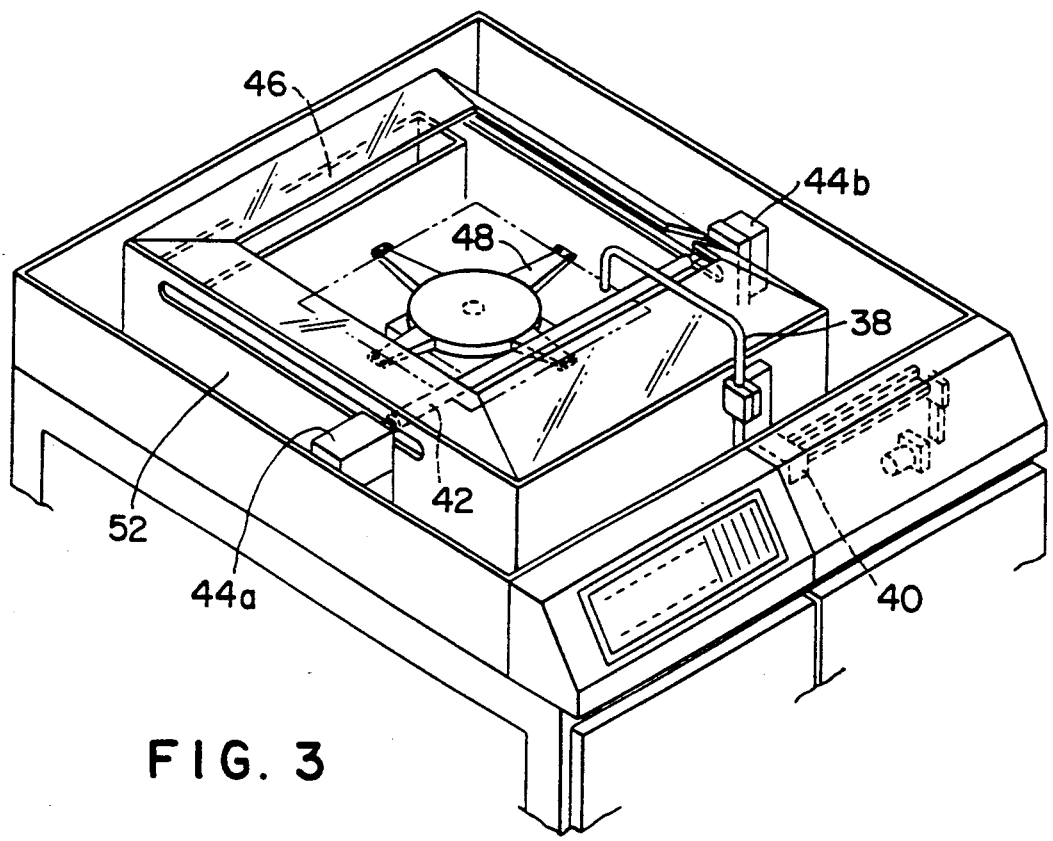
FIG. 3 and FIG. 4 are a perspective view and a vertical sectional view, respectively, showing a second embodiment according to the present invention.
Figure 4:
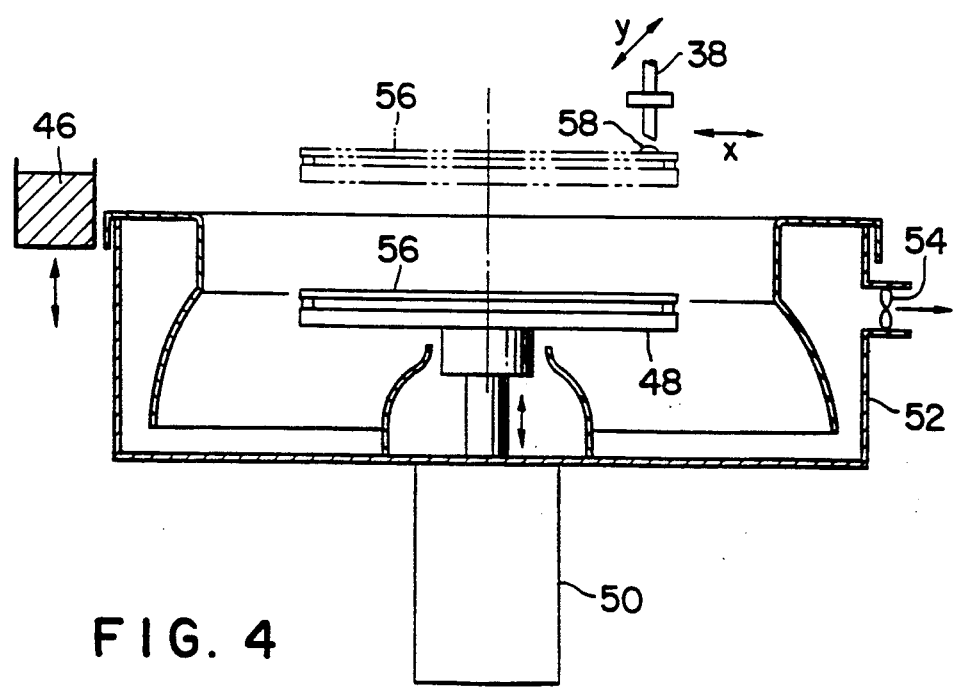
Figure 5:
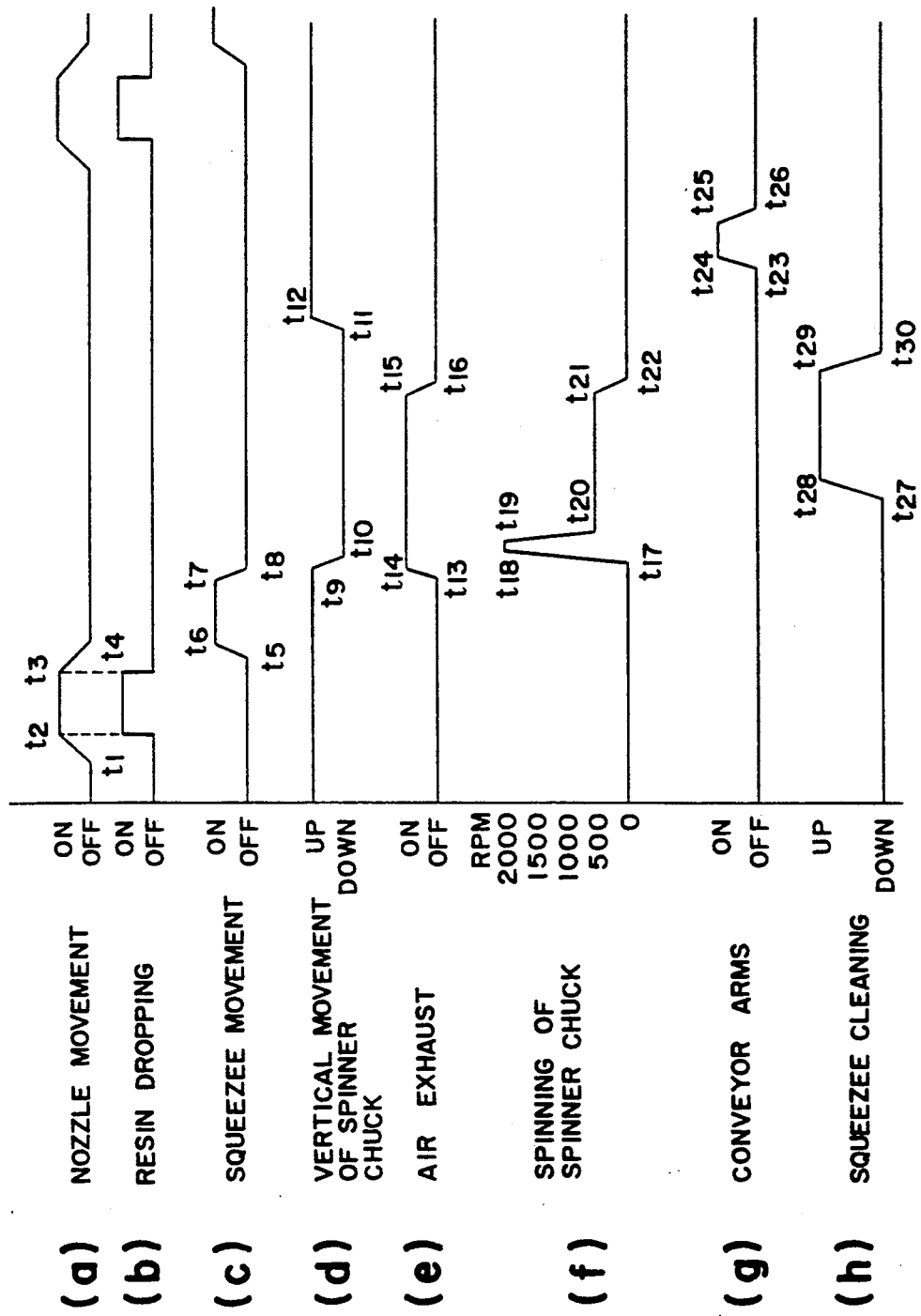
FIG. 5 is a diagram showing an operating sequence of the second embodiment of the present invention.

FIG. 3 and FIG. 4 are views showing a second embodiment of the viscous liquid coating apparatus according to the present invention, and FIG. 5 shows a graph showing an operating sequence of the second embodiment.

The second embodiment of the present invention has the squeezee coating portion and the spin coating portion combined into one unit. In the embodiment shown in FIG. 2, it takes time for the automatic conveying from the squeezee coating portion 14 to the spin coating portion 28, so that according to the type of resist, it is not possible to use this embodiment because of drying and deformation of the resist.

The resists that can be used in the apparatus of FIG. 2 are, for example, water soluble resists (gelatine), resists containing pigment dispersed therein, an aqueous solution of PVA, JDS (Product of Nippon Gosei Gomu, K.K., Japan) and CFP (Product of Chisso Kabushiki Kaisha, Japan). The resists that can be used in the apparatus of FIG. 3 are, for example, JSR-703 (Product of Nippon Gosei Gomu Kabushiki Kaisha, Japan), OMR-85 and OMR-83 (Product of Tokyo Ohka Kogyo Kabushiki Kaisha, Japan) and OFPR-800 and OFPR-2 (Products of Tokyo Ohka Kogyo K.K., Japan), an aqueous solution of PVA, JDS of which the principal component is acrylic resin (Product of Nippon Gosei Gomu, K.K., Japan) and CFP of which the principal component is acrylic resin (Product of Chisso Kabushiki Kaisha, Japan).

A spinner cup 52 has therein a spinner chuck 48 that can move in the up and down direction. A coating nozzle 38 and a squeezee 42 are provided at a height corresponding to the most elevated position of the spinner chuck 48.

The following is a more detailed description of the structure and the operation of specific portions of the coating apparatus shown in FIGS. 3 and 4, the description being made with reference to the chart of FIG. 5.

A glass sheet with a size of 300 mm × 320 mm × 1.1 ′mm is used as the substrate 56 and a pigment-dispersed resist is used as the photo-sensitive resist 58 which is to be coated to a thickness of 1.3 μm.

First, the spinner chuck 48 is placed in the elevated position (FIG. 5(d)). Then, while a carriage 40 for a coating nozzle 38 is moving from $t_1$ to $t_4$ in FIG. 5(a), drops of a photo-sensitive resist 58 are dropped from the nozzle 38 along an edge of a substrate 56 (from $t_2$ to $t_3$ in FIG. 5(a)).

Then, the squeezee 42 is moved at a constant speed (5 cm/sec) and the resist 58 on the substrate 56 is spread over the entire surface ($t_5$ to $t_8$ in FIG. 5(c)). When this is done, the gap between the squeezee 42 and the substrate 56 is set to 20 μm.

As soon as the viscous liquid has been spread by the squeezee 42, the spinner chuck 48 is lowered into the spinner cup 52 (from $t_9$ to $t_{10}$ in FIG. 5(d)), and a spin motor 50 is rotated at a high speed of 1900 rpm ($t_{18}$ to $t_{19}$ in FIG. 5(f)), and then the motor is rotated at an intermediate speed of 500 rpm ($t_{20}$ to $t_{21}$ in FIG. 5(f)). In this manner, a short spin method is adopted so that the acceleration time is less than one second ($t_{17}$ to $t_{18}$) so that no fringe is formed within 10 mm from the rim of the substrate 56.

During this time, an exhaust fan 54 rotates and exhausts the air from inside the spinner cup 52 ($t_{13}$ to $t_{16}$ in FIG. 5(e)). In addition, the squeezee 42 is cleaned and dried inside the cleaning tank 46 ($t_{27}$ to $t_{30}$ of FIG. 5(h)).

The substrate 56 to which the photo-sensitive resist 58 has been uniformly applied is conveyed from inside the spinner cup 52 by conveyor arm (not indicated in the figure) ($t_{23}$ to $t_{26}$ of FIG. 5(g)).

As a result of this, it is possible to obtain a resist film with a thickness deviation of 1.3 μm±2.0% inside the effective picture element area of the substrate 56.

In this manner, with the present invention, it is possible to obtain a high efficiency of resist utilization (¼ to 1/5 less than that conventionally obtainable) and it is also possible to hold down the deviation of the thickness of the film formed on the flat substrate to ±2%.

Figure 7:
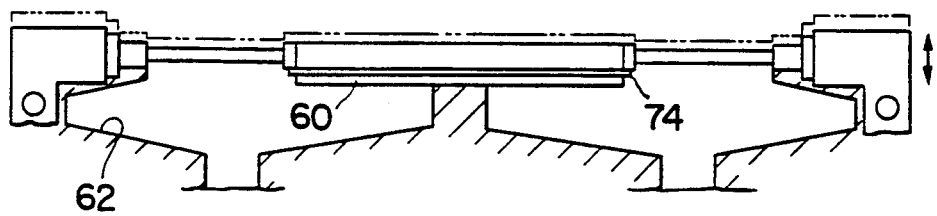
Figure 8:
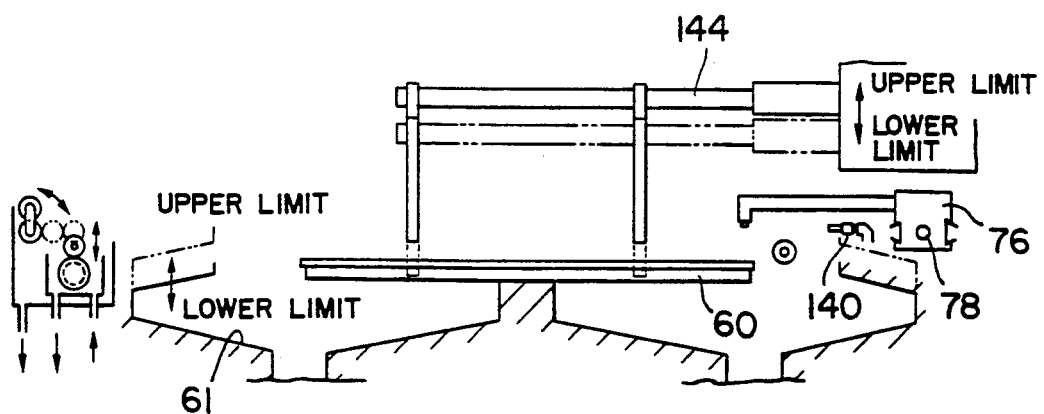

FIG. 6 through FIG. 15 are views indicating a third embodiment according to the present invention with FIG. 6 being a plan view of the main portions, FIG. 7 being a section of FIG. 6 through line VII—VII and FIG. 8 being a section of FIG. 6 through line VIII—VIII.

The viscous liquid coating apparatus according to a third embodiment of the present invention has a combined squeezee coating portion and spin coating portion in the same manner as the second embodiment but also has improvements to certain portions of the structure.

More specifically, this coating apparatus has a substrate 74 fixed by a vacuum and also has a spinner chuck 60 (FIG. 7 and FIG. 12) to apply a spin rotation, a coating nozzle 76 to drop resist 80 (FIG. 11) along an edge portion of the substrate 74, a squeezee 90 to spread the dropped resist 80 over the entire surface of the substrate 74, a squeezee cleaning portion 124 to clean off the resist 80 that adheres to the squeezee 90, and chuck cleaning nozzles 140 and 142 (FIG. 6) to clean off the resist 80 that adheres to the periphery of the spinner cup 62 and the rim of the spinner chuck 60 in the coating process.

The spinner chuck 60 is provided in the middle of the spinner cup 62, as indicated in FIG. 6 and FIG. 7. As indicated in FIG. 9 and in FIG. 10 which is an elevational section of FIG. 9, the spinner chuck 60 comprises a vertical motor shaft 64, a chuck receiver 66, a chuck lower section 68, a chuck middle section 70 and a chuck upper section 72. FIG. 9 and FIG. 10 show approximately one quarter of the spinner chuck 60, with the middle portions being omitted. The motor shaft 64 is provided with a large-diameter path 64a and a small-diameter path 64b.

The chuck receiver 66 is provided with a circular flange 66b on the upper end of a cylindrical portion 66a, and on top of this is formed a protruding portion 66c having an annular shape. The inner wall of the cylindrical portion 66a is fitted onto the top end of the motor shaft 64. This chuck receiver 66 has a communicating path 66d connected to the large-diameter path 64a of the motor shaft 64, a communicating path 66e connected to the small-diameter path 64b of the motor shaft 64, and an annular communicating path 66f connected to the path 66e, and four radial communicating paths 66g connected to the communicating path 66f.

The chuck lower section 68 is provided with a raised side wall 68b around the periphery of a bottom plate 68a, and a connecting hole 68c provided at the middle part is fitted on the circular flange 66b of the chuck receiver 66. The chuck middle section 70 has a connecting hole 70b provided in the middle portion of a rectangular plate 70a. The hole 70b fits on a circular protruding portion 66c of the flange 66b of the chuck receiver 66. The rectangular plate 70a is placed in the chuck lower section 68a with a gap maintained therebetween. The chuck middle section 70 has a Greek-cross shaped groove 70d formed in the central portion of its upper surface and a protruding portion 70c around the periphery of its upper surface. The chuck upper section 72 is mounted in the chuck middle section 70. The substrate 74 is held by the protruding portion 70c around the outside of the chuck middle section 70.

The large-diameter path 64a of the motor shaft 64 is connected via a three-way valve (not shown in the figure), and air from a compressed air source or a vacuum from a vacuum pump is selectively supplied by operating the valve. The large-diameter path 64a communicates with the flow path 66d in the protruding portion 66c, the Greek-cross shaped groove 70d of the chuck middle section 70, and the gap between the chuck upper section 72 and the chuck middle section 70. While the resist is being applied, the vacuum applies a suction force to the substrate 74. When the spinner chuck 70 and the spinner cup 72 are being cleaned, the compressed air is supplied so that the entry of the cleaning liquid into the spinner chuck is prevented.

The small-diameter path 64b of the motor shaft is supplied with compressed air from the compressed air source. The small-diameter path 64b is connected to the communicating path 66e, the communicating path 66f, the communicating paths 66g, and the gap between the chuck lower section 68 and the chuck middle section 70, and the supply of compressed air into these paths when the resist is being applied prevents the intrusion of the resist.

As indicated in FIG. 6 and FIG. 11, the coating nozzle 76 moves at an arbitrary speed along the guide rails 78 and drops resist 80 along the edge portion of the substrate 74. In this embodiment, the speed of movement of the coating nozzle 76 is set to about 100 mm/sec.

Sensors 82, 84, 86 and 88 are provided in the outer side of the coating nozzle 76. These sensors are noncontact sensors to detect the coating nozzle 76. The outputs of the sensor 82 and the sensor 84 are delayed by a timer and are used as signals to determine the timing of the start and end of the discharge of the resist 80. Further, the speed of movement of the coating nozzle 76 is variable between the sensors 82 and 84, between the sensors 84 and 86, and between the sensors 86 and 88.

A squeezee 90 is for spreading the resist 80 dropped along an edge portion of the substrate 74, over the entire surface of the substrate 74, and as shown in FIG. 6, moves along guide rails 92 and 94.

In this embodiment, the squeezee 90 can maintain the amount of gap even if there is a deviation in the thickness of the substrate 74. As indicated in FIG. 12 and FIGS. 13A and 13B, both ends of the cylindrical squeezee rod 96 have a radius which is larger than the radius of the squeezee rod 96 by a predetermined gap amount δ. The squeezee 90 is provided with guides 98 made of Teflon (Trade name, E.I. du Pont de Nemours & Co., Inc.) in order to prevent wear. The guides 98 of the squeezee 90 move in direct contact with the two sides of the substrate 74 so that it is possible to maintain the predetermined amount of gap δ between the squeezee rod 96 and the substrate 74.

If the weight of the squeezee 90 applied to both sides of the substrate 74 is great, then the substrate 74 will be deformed and may possibly change the amount of gap. It therefore has been given the structure described below in order to prevent this. As is shown in detail in FIGS. 13A and 13B, a shaft 100 is provided on the outside of the guide 98 of the squeezee 90. The guided member 102 that moves on the guide rails 94 is provided with a horizontal support rod 104 and this support rod 104 is provided with an arm 106, which is provided with an elongated hole 106a into which the shaft 100 is inserted with play. Because of this, the weight that is applied to both sides of the substrate 74 becomes only that of the squeezee rod 96, the guide 98 and the shaft 100, and the substrate 74 does not deflect to cause fluctuations in the amount of gap δ.

Alternatively, for the same purpose, the squeezee 90 may have a structure as indicated in FIGS. 14A and 14B. A shaft 12 is provided on the side of a guide 110 provided on the squeezee rod 108, and a crank shaft 116 is connected via an arm 114 to the shaft 112. This crank shaft 116 is held by an arm 118 and the other end of the shaft 116 is provided with a weight 122 via an arm 120 so as to balance the squeezee rod 108.

The squeezee cleaning portion 124 is disposed on the side opposite the coating nozzle 76, as is indicated in FIG. 6, FIG. 15 and FIG. 16. Cleaning liquid 128 (FIG. 16) is supplied from a supply conduit 126a to the cleaning tank 126 and is discharged from the discharge conduit 126b. Inside the supply tank 126 is rotatably disposed a nylon cleaning brush 130. The diagonally upward side of the supply conduit 126a has a roller unit. This roller unit comprises a squeezing roller 132 and a wiping roller 134 connected by a frame 136 so that the wiping roller 134 can swing about the shaft of the squeezing roller 132. The cleaning tank 126, the squeezing roller 132 and the wiping roller 134 are covered by an outer case 138 and cleaning liquid overflowing from the cleaning tank 126 is discharged from the discharge conduit 138a.

The squeezee 90 moves to the position of the cleaning tank 126 as soon as the squeezee coating has been completed. When the squeezee rod 96 moves to the upper position of the cleaning tank 126, the cleaning brush 130 performs the cleaning of the squeezee rod 96. Then, the squeezee rod 96 rises and the wiping roller 134 swings 90° clockwise as viewed in FIG. 16 and wipes the surface of the squeezee rod 96. Then, the cleaning liquid contained in the wiping roller 134 is squeezed out by the squeezing roller 132 and is wiped off. The wiping roller 134 returns to the initial position by swinging counter-clockwise. During this time, the cleaning tank 126 is drained and fresh cleaning liquid is filled from the supply valve.

As shown in FIG. 6 and FIG. 8, the chuck cleaning nozzles 140 and 142 are provided on the side of the coating nozzle 76 inside the spinner cup 62. These chuck cleaning nozzles 140 and 142 discharge cleaning liquid (such as pure water, for example) onto the spinner chuck 60 and at the same time, the spinner chuck 60 rotates and performs cleaning by the centrifugal force causing the resist that has adhered around the spinner cup 62 and the periphery of the spinner chuck 60 to be removed.

As indicated in FIG. 6 and FIG. 8, conveyor arms and 146 perform the conveying in and conveying out of the substrate 74 to and from the spinner chuck 60 inside the spinner cup 62. In this embodiment, first conveyor arms 144A and 146A and second conveyor arms 144B and 146B are respectively disposed on both sides of the spinner cup 62 and perform alternate conveying in and conveying out of the substrate 74 to and from the spinner chuck 60 inside the spinner cup 62 and therefore promote efficiency.

FIG. 17 and FIG. 18 are graphs for describing the characteristics of the third embodiment according to the present invention. FIG. 17 indicates the relationship between the amount of gap between the squeezee and the substrate, and the minimum amount of resist drops, and FIG. 18 indicates the relationship between the squeezee movement speed and the minimum amount of resist drops.

In order to raise the efficiency of utilization of the resist, it is necessary to find the minimum drop amount enabling the entire surface of the substrate to be uniformly coated.

Glass plates were used as substrates each with a size of 300 mm×320 mm×1.1 mm. One glass plate was a normal glass plate and another glass plate was a glass plate on one surface of which is applied a chromium pattern as a light intercepting layer for increasing the contrast. A water soluble photo-sensitive resin containing dispersed blue pigment was applied to the glass plates and the following test was performed. In FIGS. 17 and 18, the normal glass plate is indicated by solid line and the glass plate with the pattern indicated by chain line.

The squeezee feed speed was set to a constant speed (of 73 mm/sec) and the gap between the substrate and the squeezee was made 0.10 mm, 0.15 mm and 0.20 mm respectively. Under these conditions, the minimum amount of the resist that was necessary to be dropped to achieve a uniform coating was measured, and the results indicated in FIG. 17 were obtained. In this embodiment, these results were used to determine the minimum amount of resist that had to be dropped, on the basis of the amount of gap between the substrate and the squeezee.

While the amount of gap between the substrate and the squeezee is set to 0.10 mm, 0.15 mm and 0.20 mm, respectively, the squeezee feed speed was changed and the minimum amount of resist measured. As indicated in FIG. 18, lowering the feed speed of the squeezee decreases the minimum amount of resist that has to be dropped, and furthermore, this effect becomes larger for the larger amount of the gap. In addition, it can also be seen that for each of the gap sizes, at feed speeds of 40 mm/sec or more, an approximately constant amount of dropped resist can make stable coating irrespective of the feed speed of the squeezee Therefore, in consideration of the throughput and the stability of the coating, the feed speed was set at approximately 60 mm/sec in the apparatus of the third embodiment.

FIG. 19 is a process diagram describing the coating process of the third embodiment. In this process diagram, the arrows indicate "during motion", in consideration of the timing of the sensor output.

The first conveyor arms 144A and 146A first move from a middle position to a washing chamber position ($t_1$ to $t_2$ of FIG. 19($a$)), and then from the arm upper limit position to the arm lower limit position indicated in FIG. 8 ($t_3$ to $t_4$ of FIG. 19($a$)), and the closing of the arms ($t_5$ to $t_6$ of FIG. 19($a$)) causes the substrate 74 to be held inside a washing chamber (not shown) of an apparatus for washing the substrate preliminarily. Then, the arms move from the lower limit position to the upper limit position ($t_7$ to $t_8$ of FIG. 19($a$)) and from the washing chamber position to a coating position in which the substrate is placed in the coating apparatus according to this invention ($t_9$ to $t_{10}$ of FIG. 19($a$), and the arms move from the upper limit position to the lower limit position ($t_{11}$ to $t_{12}$ of FIG. 19($a$)), to open the arms ($t_{13}$ to $t_{14}$ of FIG. 19($a$)) and the substrate 74 is placed on the spinner chuck 60. Then, the arms move from the lower limit position to the upper limit position ($t_{15}$ to $t_{16}$ of FIG. 19($a$)) and from the coating position to the middle position and enters the standby state ($t_{17}$ to $t_{18}$ of FIG. 19($a$)).

In synchronization with the timing ($t_{10}$ of FIG. 19($a$)) by which the first arms 144A and 146A move from the washing chamber position to the coating position, the coating nozzle 76 performs spraying of resist for a predetermined period of time ($t_{19}$ to $t_{20}$ of FIG. 19($c$)). Then, in synchronization with the timing ($t_{16}$ of FIG. 19($a$)) by which the arms move from the lower limit position to the upper limit position, the coating nozzle 76 moves from a start position to the end position indicated in FIG. 6 ($t_{21}$ to $t_{22}$ of FIG. 19($c$)) and performs the spraying of resist for a predetermined period of time ($t_{23}$ to $t_{24}$ in FIG. 19($c$)). After this has been performed, the nozzle 76 moves back from the end position to the start position ($t_{25}$ to $t_{26}$ of FIG. 19($c$)).

The squeezee 90 moves from the start position to the end position indicated in FIG. 6 by the outputs from the sensors that detect the positions of the coating nozzle 76 ($t_{27}$ to $t_{28}$ of FIG. 19($d$)). When this occurs, the squeezee 90 moves from the lower limit position to the upper limit position ($t_{29}$ to $t_{30}$ of FIG. 19($d$)). Then, the squeezee 90 moves from the coating end position to the end point ($t_{31}$ to $t_{32}$ of FIG. 19($d$)), and then moves from the top limit position to the lower limit position ($t_{33}$ to $t_{34}$ of FIG. 19($d$)).

In synchronization with the timing of the movement of the squeezee 90 to the end point, the spin motor has the motor lock cancelled and becomes free ($t_{35}$ to $t_{36}$ of FIG. 19($e$)). At the same time as this, the spinner cup 62 moves from the lower limit position to the upper limit position ($t_{37}$ to $t_{33}$ of FIG. 19($f$)). In accordance with a predetermined spinning program, the spin motor turns on and off ($t_{39}$ to $t_{44}$ of FIG. 19($f$)), and then the spinner cup 62 moves from the upper limit position to the lower limit position ($t_{43}$ to $t_{44}$ in FIG. 19($f$)). The spin motor performs the return of the spinner chuck 60 to the start position and then turns off ($t_{45}$ of FIG. 19($e$)). The motor then changes from the free state to the locked state ($t_{47}$ to $t_{48}$ of FIG. 19($e$)).

When the spin coating by the spin motor has been completed, the second conveyor arms 144B and 146B move from the middle position to the coating position ($t_{47}$ to $t_{50}$ of FIG. 19($b$)), and move from the arm upper limit position to the arm lower limit position indicated in FIG. 8 ($t_{51}$ to $t_{52}$ of FIG. 19($b$)) and then the closing of the arms holds the substrate 74 inside the coating apparatus. Then, the arms move from the lower limit position to the upper limit position ($t_{55}$ to $t_{56}$ of FIG. 19($b$)) and move from the coating position to a drying chamber position ($t_{57}$ to $t_{58}$ of FIG. 19($b$)), and the arms move from the upper limit position to the lower limit position ($t_{59}$ to $t_{60}$ of FIG. 19($b$)), to open the arms ($t_{61}$ to $t_{62}$ of FIG. 19($b$)) and to move the substrate 74 to a drying chamber. Then, the arms move from the lower limit position to the upper limit position ($t_{63}$ to $t_{64}$ of FIG. 19($b$)) and from the drying chamber position to the middle position and enters the standby status ($t_{65}$ to $t_{66}$ of FIG. 19($b$)).

On the other hand, the squeezee 90 at the end position is located above the squeezee cleaning portion 124. The cleaning brush 130 is always rotating, so that the movement of the squeezee 90 from the upper limit position to the lower limit position ($t_{33}$ to $t_{34}$ of FIG. 19($d$)) causes the cleaning to start ($t_{67}$ of FIG. 19($g$)). Immediately before the cleaning is completed ($t_{68}$ of FIG. 19($g$)), the supply of water into the cleaning tank 126 is stopped ($t_{69}$ of FIG. 19($g$)), and the discharge of water is started ($t_{71}$ of FIG. 19($g$)). At the timing when the second conveyor arms 144B and 146B move into the drying chamber ($t_{58}$ of FIG. 19($b$)), the wiping roller 134 moves from the start position to the end position ($t_{75}$ to $t_{76}$ of FIG. 19($g$)), and the wiping roller 134 which is always rotating wipes the cleaning liquid from the squeezee 90 and moves from the end position to the start position ($t_{77}$ to $t_{78}$ of FIG. 19($g$)) to finish the wiping. Immediately after this occurs, the water is discharged from the cleaning tank 126 ($t_{71}$–$t_{72}$ of FIG. 19($g$)) and the supply of water is commenced ($t_{70}$ of FIG. 19($g$)).

As soon as the substrate 74 is discharged from the spinner cup 62 ($t_{58}$ of FIG. 19($b$)), the spinner cup 62 rises ($t_{79}$ to $t_{80}$ of FIG. 19($e$)) and the spin motor lock is released ($t_{81}$ to $t_{82}$ of FIG. 19($e$)). The spin motor then rotates in accordance with a spin program ($t_{46}$ to $t_{83}$ to $t_{84}$ of FIG. 19($e$)). During this time, the chuck cleaning liquid is sprayed ($t_{89}$ to $t_{90}$ of FIG. 19($h$)). The spinner cup 62 lowers ($t_{85}$ to $t_{86}$ of FIG. 19($f$)), and the spin motor locks ($t_{87}$ to $t_{88}$ of FIG. 19($e$)).

The vacuum of the spinner chuck 60 is exerting ($t_{91}$ to $t_{92}$ of FIG. 19($i$)) from the time when the first conveyor arms 144A and 146A bring the substrate 74 into the coating apparatus ($t_{10}$ of FIG. 19($a$)), to the time when it is taken out from the coating apparatus by the second conveyor arms 144B and 146B ($t_{50}$ of FIG. 19($b$)).

The air of the spinner chuck 60 is supplied for a predetermined time ($t_{93}$ to $t_{94}$ of FIG. 19($i$)) in synchronization with the time ($t_{46}$ of FIG. 19($e$)) of the start of the spin program for the chuck cleaning.

The air at the outer periphery of the spinner chuck 60 is supplied from the time ($t_{16}$ in FIG. 19($a$)) when the first conveyor arms 144A and 146A move to the upper limit position to the time ($t_{50}$ in FIG. 19($b$)) when the second conveyor arms 144B and 146B move to the upper limit position. The air of the outer periphery of the spinner chuck 60 is also supplied for a predetermined time ($t_{97}$ to $t_{98}$ of FIG. 19($i$)) in synchronization with the time ($t_{46}$ of FIG. 19($e$)) of the start of the spin program for the chuck cleaning.

The time of one cycle from the time when the substrate 74 is conveyed into the coating apparatus, up to the completion of the process is 80 sec.

The following is a description of the case where a color filter (for color separation) is manufactured using the viscous liquid coating apparatus of the third embodiment of the present invention.

Red, green and blue pigments are dispersed in a photo-sensitive resin in the proportions indicated in the Table 1 below and the red, green and blue colored photo-sensitive resins were manufactured.

TABLE 1

| (Unit: weight %) | |
|---|---|
| (1) Red photosensitive resin | |
| Pyrazolone Red (red pigment) | 10 |
| Polyvinyl alcohol/5% Stilbazolium.quinolium (photo-sensitive resin) | 05 |
| Water | 85 |
| (2) Green photosensitive resin | |
| Cyanine Green [Green 2Y-301 (green pigment produced by Morohoshi Ink K.K. Japan)] | 09 |
| Polyvinyl alcohol/5% Stilbazolium.quinolium (photo-sensitive resin) | 05 |
| Water | 86 |
| (3) Blue photosensitive resin | |
| Cyaninine Blue [Fastogen Blue (Product of Morohoshi Ink K.K., Japan)] | 03 |
| Polyvinyl alcohol/5% Stilbazolium.quinolium (photo-sensitive resin) | 05 |
| Water | 92 |

As pigments, the following may also be used.
Red pigment: Monoazo (Novoperm Red HF2B, product of Morohoshi Ink K.K.)
Green pigment: Rionol Green 2 YS (Product of Morohoshi Ink K.K.)
Blue pigment: Fastogen Blue GNPSG (Product of Morohoshi Ink K.K.)

As shown in FIG. 20A, the substrate used is a 1.1 mm thick glass substrate 140 (AL glass, produced by Asahi Glass K.K., Japan) which has been thoroughly cleaned.

On top of this substrate was coated a red photo-sensitive resin 142 to a thickness of 1.2 μm, by using the squeezee and the spin coating method according to the present invention. When this was done, the substrate was dried in an oven at 70° C. for a period of 30 minutes and a mercury lamp was used via a mask 144 to expose the substrate. Spray developing in water was performed for one minute and red relief picture elements R were formed in the area for which the red-color picture elements were to be formed, as is indicated in FIG. 20B, and then heat setting was performed at 150° C. for 30 minutes.

The same process was repeated with an increased gas between the squeezee and the substrate surface and green relief picture elements G were formed in the area for which the green-color picture elements were to be formed, and in the same manner with an creased gap, blue relief picture elements B were formed in the area for which the blue-color picture elements were to be formed, as is indicated in FIG. 20C.

Finally, a transparent resin was coated to a thickness of 2 μm and heat setting was performed at a temperature of 150° C. for 30 minutes.

Then, the viscous liquid coating apparatus (squeezee coating and spin coating) according to the present invention and a conventional apparatus using only the spin coating method were used to make two substrates, and the results of the coating were compared.

A comparison of the resist utilization efficiency is shown in Table 2.

TABLE 2

| | Present invention | | Spin coating | |
|---|---|---|---|---|
| | Utilization | Cost | Utilization | Cost |
| Red | 33.8% | 42 | 2.0% | 466 |
| Green | 8.8% | 160 | 2.0% | 445 |
| Blue | 8.8% | 160 | 3.1% | 522 |
| Total | — | 362 | — | 1,433 |

As can be seen from Table 2, there is high utilization efficiency of 33.8% for the red-color resist used to form the red picture elements but the utilization efficiency was 8.8% in the case of the green-color resist used to form the green picture elements and the blue-color resist used to form the blue picture elements. The reason for this was that in the process for the manufacture of a LCD-color filter, when the picture element pattern having three colors respectively formed on a substrate, the red picture elements R that are formed initially are coated to a thickness of 0.1 mm for the gap between the substrate 140 and the squeezee. However, when the second color (green) and the third color (blue) resists are formed, there is already a red picture element pattern R to a thickness of 1.2 μm already formed on the substrate and this also has to be coated with resist and so unevenness is generated when the squeezee coating is performed for a gap of 0.1 mm. Therefore, in order to eliminate this unevenness, as indicated in FIG. 20B and FIG. 20C, the gap thickness must be increased to 0.2 mm, for example, and the squeezee coating performed. However, the total cost of the resist is about one quarter so that the effective utilization of the resist is achieved. Even if the gap g is made larger for the second and third colors, the resist coated in the squeezee process for the second and third colors spreads in the spin process to form a thickness that is the same as that of the picture elements that have already been formed.

FIGS. 21A and 21B and FIGS. 22A and 22B show a comparison of thickness distribution characteristics of the resin coatings formed by the third embodiment of the present invention, and by a conventional apparatus.

In the example indicated in FIGS. 21A and 21B, the resist is a negative resist having pigment dispersed in PVA-5% stilbazolium quinolium and having a viscosity of 40 to 45 cps. The substrate used for the testing had a size of 300 mm × 300 mm × 1.1 tmm.

As a result of this, the heaping of the resist coating in the central portion of the substrate was remarkably less in the present invention (FIG. 21A) than in the conventional apparatus (FIG. 21B). In addition, the variation of the coating thickness within a circle of 300 mm diameter bounded by the sides of the substrate was ±5.5% for a conventional example but was within ±3.5% for the present invention.

In the example indicated in FIGS. 22A and 22B, the resist used for the test was a positive novolak resist having a viscosity of 6 cps and the size of the substrate was 300 mm × 300 mm × 1.1 'mm.

As a result of this, the heaping of the resist coating in the central portion of the substrate was less in the present invention (FIG. 22A) than in the conventional apparatus (FIG. 22B). In addition, the variation of the coating thickness within a circle of 300 mm diameter bounded by the sides of the substrate was ±3.0% for a conventional example but was within ±2.0% for the present invention.

FIG. 23 is a graph indicating a comparison of the relationship between foreign matter and the resist drop amount for the third embodiment of the present invention, and for those of a conventional apparatus.

When the substrate was coated with a resist under the same conditions as have been described, it was necessary to use more than 30 g of resist in the case where only the conventional spin coating method was used, and it can be seen that there is an increase in the amount of included foreign matter when the amount of resist drop increases. Because there is a large amount of excess resist held in the spinner cup, this foreign matter is dispersed to re-adhere to the substrate.

In the present embodiment, the amount of resist was less than 30 g and practically no foreign matter was observed.

As has been described in detail above, according to the present invention, using a squeezee to spread a viscous liquid to a predetermined thickness prior to spin coating makes it possible to greatly reduce the amount of viscous liquid when compared to a conventional apparatus. In addition, there is less variation of the thickness of the coating, and a thin and uniform coating can be formed throughout the entire surface.

Accordingly, when expensive resist is used for coating, it is possible to achieve a large reduction in the cost of the materials.

In addition, according to the present invention, it is possible to form a uniform coating of a water-soluble type photo-sensitive resin wherein it has conventionally been difficult to form a uniform coating, so that it becomes unnecessary to use the solvent type photo-sensitive resins which need a solvent recovery apparatus, whereby the cost for the resin coating is reduced.

Furthermore, according to the present invention, when color filters are manufactured, it is possible to obtain color filters of extremely high quality that do not have unevenness in brightness and density

What is claimed is:

1. A method of forming a coating of a viscous liquid on a surface of an object, comprising the steps of:
    applying the viscous liquid along an edge portion of the surface of the object;
    moving a squeezee along the surface of the object with a gap therebetween to spread the applied viscous liquid over at least a part of the surface of the object; and
    spinning the object in the plane of the surface thereof to disperse the spread viscous liquid uniformly by centrifugal force over the entire surface of the object.

2. The method according to claim 1, wherein the viscous liquid is applied to the surface of the object by dropping the liquid from a coating nozzle.

3. The method according to claim 2, wherein the viscous liquid is applied to the surface in a line along the edge portion by moving the coating nozzle along the line.

4. The method according to claim 3, wherein the squeezee is moved from said edge portion of the surface to a portion of the surface, opposite to the edge portion.

5. The method according to claim 1, further comprising the step of transferring the object, after the viscous liquid has been spread by moving the squeezee, to another place where the step of spinning the object is carried out.

6. The method according to claim 1, further comprising the step of lowering the object, after the viscous liquid has been spread by moving the squeezee, into a spinner cup in which the step of spinning the object is carried out.

7. The method according to claim 1, further comprising the step of cleaning the squeezee after the squeezee has completed spreading the viscous liquid.

* * * * *